(12) United States Patent
Kang et al.

(10) Patent No.: US 11,160,176 B2
(45) Date of Patent: Oct. 26, 2021

(54) DISPLAY DEVICE AND MANUFACTURING METHOD THEREOF

(71) Applicant: Samsung Display Co., Ltd., Yongin-si (KR)

(72) Inventors: Minsoo Kang, Hwaseong-si (KR); Seungjae Kang, Asan-si (KR); Sungjoon Kim, Hwaseong-si (KR); Kiyong Park, Seoul (KR); Jonghyeon Choi, Pyeongtaek-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 83 days.

(21) Appl. No.: 16/565,666

(22) Filed: Sep. 10, 2019

(65) Prior Publication Data

US 2020/0084899 A1 Mar. 12, 2020

(30) Foreign Application Priority Data

Sep. 10, 2018 (KR) .................... 10-2018-0107917

(51) Int. Cl.
| | |
|---|---|
| H05K 7/00 | (2006.01) |
| H05K 5/00 | (2006.01) |
| G02F 1/1345 | (2006.01) |
| H05K 1/14 | (2006.01) |

(52) U.S. Cl.
CPC ....... *H05K 5/0069* (2013.01); *G02F 1/13452* (2013.01); *H05K 1/141* (2013.01); *H05K 2201/045* (2013.01)

(58) Field of Classification Search
USPC ........................................................ 361/749
See application file for complete search history.

(56) References Cited

U.S. PATENT DOCUMENTS

| | | |
|---|---|---|
| 8,143,785 B2 | 3/2012 | Kang |
| 9,535,302 B2 | 1/2017 | Lee |
| 10,476,185 B2 | 11/2019 | Kim et al. |
| 2010/0177498 A1 | 7/2010 | Choi et al. |
| 2018/0068992 A1 | 3/2018 | Oh |
| 2018/0121013 A1 | 5/2018 | Yun et al. |
| 2018/0224676 A1 | 8/2018 | Yoshii |
| 2019/0245283 A1 | 8/2019 | Oh |

FOREIGN PATENT DOCUMENTS

| | | |
|---|---|---|
| JP | 2007-086162 | 4/2007 |
| KR | 10-0918052 | 9/2009 |
| KR | 10-2015-0094829 | 8/2015 |
| KR | 10-1722402 | 4/2017 |
| KR | 10-2018-0049408 | 5/2018 |
| KR | 10-2019-0090102 | 8/2019 |
| KR | 10-2019-0096463 | 8/2019 |

OTHER PUBLICATIONS

Examination Report dated Dec. 20, 2019, issued in European Patent Application No. 19196108.5.

*Primary Examiner* — Andargie M Aychillhum
(74) *Attorney, Agent, or Firm* — H.C. Park & Associates, PLC

(57) ABSTRACT

A display device includes a display panel, a main circuit board, a first connecting circuit board, a second connecting circuit board, and a sealing member. The display panel includes a first pad row and a second pad row. The first connecting circuit board is connected to the first pad row, and the second connecting circuit board is connected to the second pad row. The second pad row is spaced farther from an edge of the display panel than the first pad row. The sealing member is disposed between the first connecting circuit board and the second connecting circuit board to seal a gap between the first connecting circuit board and the display panel.

20 Claims, 17 Drawing Sheets

DISPLAY DEVICE AND MANUFACTURING METHOD THEREOF

CROSS-REFERENCE TO RELATED APPLICATION

This application claims priority from and the benefit of Korean Patent Application No. 10-2018-0107917, filed on Sep. 10, 2018, which is hereby incorporated by reference for all purposes as if fully set forth herein.

BACKGROUND

Field

Exemplary embodiments/implementations of the invention relate generally to a display device and a manufacturing method thereof, and more specifically, to a display device including a slim bezel area and a manufacturing method thereof.

Discussion of the Background

In general, a display panel is manufactured, and then a circuit board is connected to the display panel. For example, a tape automated bonding (TAB) mounting method allows the circuit board to be bonded to the display panel by using an anisotropic conductive film ACF.

In recent years, various designs of the display panel for reducing a bezel area (or a non-display area) have been researched.

The above information disclosed in this Background section is only for understanding of the background of the inventive concepts, and, therefore, it may contain information that does not constitute prior art.

SUMMARY

Devices constructed according to exemplary embodiments and methods according to exemplary implementations of the invention are capable of preventing or reducing oxidation due to moisture permeation of a connection between a circuit board and a display panel via a sealing member, that may also increase a coupling force between the circuit board and the display panel to prevent or reduce delamination of the anisotropic conductive film.

Additional features of the inventive concepts will be set forth in the description which follows, and in part will be apparent from the description, or may be learned by practice of the inventive concepts.

An exemplary embodiment of the inventive concepts provides a display device including: a display panel, a main circuit board, a first connecting circuit board, a second connecting circuit board, a first sealing member, and a second sealing member. The display panel includes an insulation layer, first pads that are arranged in a first direction and exposed from the insulation layer, and second pads that are spaced apart from the first pads in a second direction crossing the first direction, arranged in the first direction, and exposed from the insulation layer. The second pads are spaced farther from an edge of the display panel than the first pads in the second direction.

The first connecting circuit board is electrically connected to the first pads and the main circuit board. The second circuit board is electrically connected to the main circuit board and the second pads and disposed above the first connecting circuit board.

The first sealing member may seal a first gap defined between the first connecting circuit board and the insulation layer. A portion of the first sealing member is disposed between the first connecting circuit board and the second connecting circuit board. The second sealing member seals a second gap defined between the second connecting circuit board and the insulation layer.

In an exemplary embodiment, the second sealing member may include a silicon resin.

In an exemplary embodiment, the first sealing member may include: a first adhesion layer attached to the first connecting circuit board; a base layer disposed on the first adhesion layer; and a second adhesion layer disposed on the base layer and attached to the second connecting circuit board.

In an exemplary embodiment, the base layer may include a silicon resin.

In an exemplary embodiment, the first sealing member and the second sealing member may include the same material as each other.

In an exemplary embodiment, the second sealing member may have a thickness greater than that of the first sealing member.

In an exemplary embodiment, the first sealing member may cover an area of an edge of the first connecting circuit board, which overlaps the display panel.

In an exemplary embodiment, the display device may further include: a first driving chip mounted to the first connecting circuit board; and a second driving chip mounted to the second connecting circuit board.

In an exemplary embodiment, a portion of the first connecting circuit board, which overlaps the first driving chip, may have a width in the first direction less than that of a portion of the first connecting circuit board, which overlaps the first pads.

In an exemplary embodiment, the display device may further include a third sealing member disposed between the first connecting circuit board and the insulation layer to couple the first connecting circuit board to the insulation layer and disposed closer to the edge of the display panel than the first pads.

In an exemplary embodiment of the inventive concepts, a display substrate includes a first pad area on which a first pad row and a second pad row, which form different pad rows, are disposed and a second pad area on which a third pad row and a fourth pad row, which form different pad rows, are disposed;

A first connecting circuit board connects the first pad area to the main circuit board and electrically connected to the first pad row. A second connecting circuit board connects the first pad area to the main circuit board, is electrically connected to the second pad row, and is disposed above the first connecting circuit board. A third connecting circuit board connects the second pad area to the main circuit board and electrically connected to the third pad row.

A fourth connecting circuit board connects the second pad area to the main circuit board, is electrically connected to the third pad row, and is disposed above the third connecting circuit board. A first outer sealing member is disposed between the first connecting circuit board and the second connecting circuit board to seal a gap defined between the first connecting circuit board and the first pad area. A second outer sealing member is disposed between the third connecting circuit board and the fourth connecting circuit board to seal a gap defined between the third connecting circuit board and the second pad area.

In an exemplary embodiment, the first outer sealing member may be spaced apart from the second outer sealing member. The first outer sealing member and the second outer sealing member may be connected to each other to define an outer sealing member.

In an exemplary embodiment, a portion of the outer sealing member connects the first outer sealing member to the second outer sealing member is defined as a connecting portion, and the connecting portion has a thickness greater than that of the first outer sealing member.

In an exemplary embodiment, the display device may further include a first inner sealing member sealing a gap between the second connecting circuit board and the first pad area, and a second inner sealing member sealing a gap between the fourth connecting circuit board and the second pad area.

In an exemplary embodiment, the first inner sealing member and the second inner sealing member may be connected to each other to define an inner sealing member.

In an exemplary embodiment, a portion of the inner sealing member connects the first inner sealing member to the second inner sealing member is defined as a connecting portion, and the connecting portion has the substantially same thickness as the first inner sealing member.

In an exemplary embodiment, the display device may further include anisotropic conductive films. Each of the anisotropic conductive films may be disposed between the first pad row and the first connecting circuit board, between the second pad row and the second connecting circuit board, between the third pad row and the third connecting circuit board, and between the fourth pad row and the fourth connecting circuit board.

In an exemplary embodiment, the display device may further include an anisotropic conductive film. The anisotropic conductive film may be disposed between the first pad row and the first connecting circuit board and between third pad row and the third connecting circuit board.

In an exemplary embodiment of the inventive concepts, a method for manufacturing a display device includes: providing a display panel including a pad area on which first pads and second pads, which are disposed on different pad rows from each other, are disposed; electrically connecting a first connecting circuit board to the first pads that is closer to an edge of the display panel than the second pads; and electrically connecting a second connecting circuit board to the second pads.

The electrically connecting of the second connecting circuit board to the second pads includes: arranging a conductive adhesion member between the second pads and pads, which correspond thereto, of the second connecting circuit board; arranging a preliminary sealing member between the first connecting circuit board and the second connecting circuit board; and pressing the conductive adhesion member and the preliminary sealing member on the second connecting circuit board by using a heating block.

It is to be understood that both the foregoing general description and the following detailed description are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this specification, illustrate exemplary embodiments of the invention, and together with the description serve to explain the inventive concepts.

DETAILED DESCRIPTION

Figure 1A:
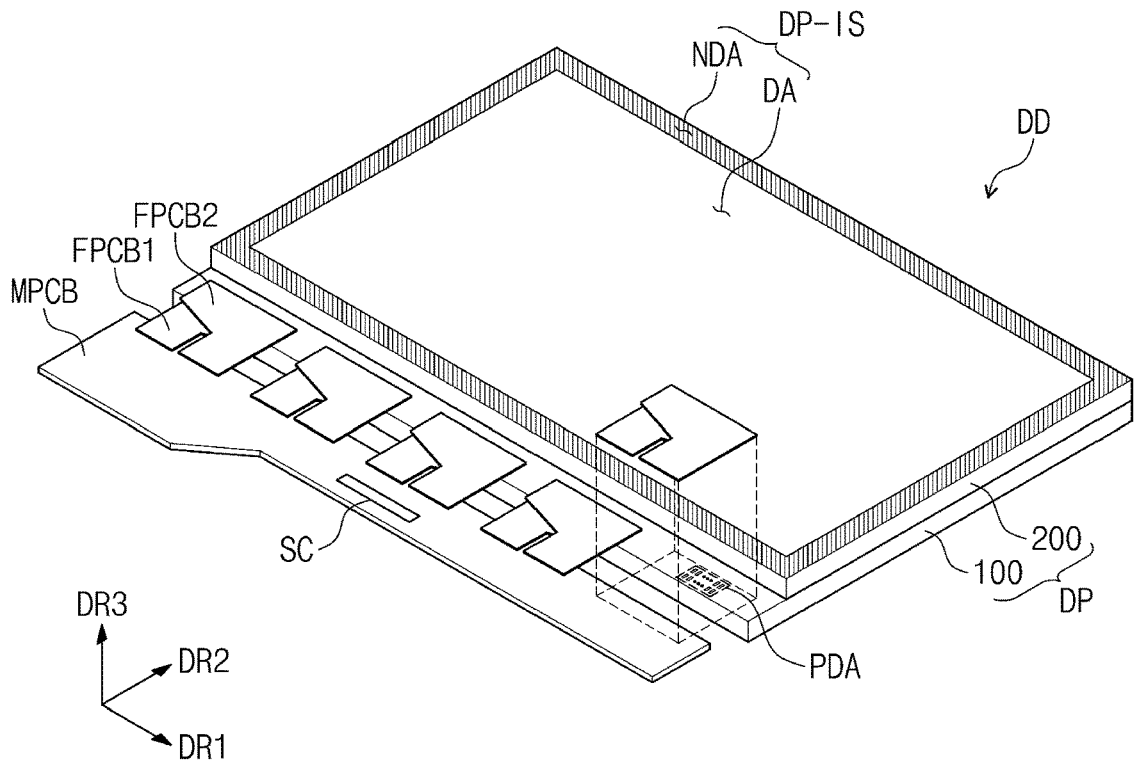
FIG. 1A is a perspective view illustrating a display device according to an exemplary embodiment of the inventive concepts.

In the following description, for the purposes of explanation, numerous specific details are set forth in order to provide a thorough understanding of various exemplary embodiments or implementations of the invention. As used herein "embodiments" and "implementations" are interchangeable words that are non-limiting examples of devices or methods employing one or more of the inventive concepts disclosed herein. It is apparent, however, that various exemplary embodiments may be practiced without these specific details or with one or more equivalent arrangements. In other instances, well-known structures and devices are shown in block diagram form in order to avoid unnecessarily obscuring various exemplary embodiments. Further, various exemplary embodiments may be different, but do not have to be exclusive. For example, specific shapes, configurations, and characteristics of an exemplary embodiment may be used or implemented in another exemplary embodiment without departing from the inventive concepts.

Unless otherwise specified, the illustrated exemplary embodiments are to be understood as providing exemplary features of varying detail of some ways in which the inventive concepts may be implemented in practice. Therefore, unless otherwise specified, the features, components, modules, layers, films, panels, regions, and/or aspects, etc. (hereinafter individually or collectively referred to as "elements"), of the various embodiments may be otherwise combined, separated, interchanged, and/or rearranged without departing from the inventive concepts.

The use of cross-hatching and/or shading in the accompanying drawings is generally provided to clarify boundaries between adjacent elements. As such, neither the presence nor the absence of cross-hatching or shading conveys or indicates any preference or requirement for particular materials, material properties, dimensions, proportions, commonalities between illustrated elements, and/or any other characteristic, attribute, property, etc., of the elements, unless specified. Further, in the accompanying drawings, the size and relative sizes of elements may be exaggerated for clarity and/or descriptive purposes. When an exemplary embodiment may be implemented differently, a specific process order may be performed differently from the described order. For example, two consecutively described processes may be performed substantially at the same time or performed in an order opposite to the described order. Also, like reference numerals denote like elements.

When an element, such as a layer, is referred to as being "on," "connected to," or "coupled to" another element or layer, it may be directly on, connected to, or coupled to the other element or layer or intervening elements or layers may be present. When, however, an element or layer is referred to as being "directly on," "directly connected to," or "directly coupled to" another element or layer, there are no intervening elements or layers present. To this end, the term "connected" may refer to physical, electrical, and/or fluid connection, with or without intervening elements. Further, the DR1-axis, the DR2-axis, and the DR3-axis are not limited to three axes of a rectangular coordinate system, such as the x, y, and z-axes, and may be interpreted in a broader sense. For example, the DR1-axis, the DR2-axis, and the DR3-axis may be perpendicular to one another, or may represent different directions that are not perpendicular to one another. For the purposes of this disclosure, "at least one of X, Y, and Z" and "at least one selected from the group consisting of X, Y, and Z" may be construed as X only, Y only, Z only, or any combination of two or more of X, Y, and Z, such as, for instance, XYZ, XYY, YZ, and ZZ. As used herein, the term "and/or" includes any and all combinations of one or more of the associated listed items.

Although the terms "first," "second," etc. may be used herein to describe various types of elements, these elements should not be limited by these terms. These terms are used to distinguish one element from another element. Thus, a first element discussed below could be termed a second element without departing from the teachings of the disclosure.

Spatially relative terms, such as "beneath," "below," "under," "lower," "above," "upper," "over," "higher," "side" (e.g., as in "sidewall"), and the like, may be used herein for descriptive purposes, and, thereby, to describe one elements relationship to another element(s) as illustrated in the drawings. Spatially relative terms are intended to encompass different orientations of an apparatus in use, operation, and/or manufacture in addition to the orientation depicted in the drawings. For example, if the apparatus in the drawings is turned over, elements described as "below" or "beneath" other elements or features would then be oriented "above" the other elements or features. Thus, the exemplary term "below" can encompass both an orientation of above and below. Furthermore, the apparatus may be otherwise oriented (e.g., rotated 90 degrees or at other orientations), and, as such, the spatially relative descriptors used herein interpreted accordingly.

The terminology used herein is for the purpose of describing particular embodiments and is not intended to be limiting. As used herein, the singular forms, "a," "an," and "the" are intended to include the plural forms as well, unless the context clearly indicates otherwise. Moreover, the terms "comprises," "comprising," "includes," and/or "including," when used in this specification, specify the presence of stated features, integers, steps, operations, elements, components, and/or groups thereof, but do not preclude the presence or addition of one or more other features, integers, steps, operations, elements, components, and/or groups thereof. It is also noted that, as used herein, the terms "substantially," "about," and other similar terms, are used as terms of approximation and not as terms of degree, and, as such, are utilized to account for inherent deviations in measured, calculated, and/or provided values that would be recognized by one of ordinary skill in the art.

Various exemplary embodiments are described herein with reference to sectional and/or exploded illustrations that are schematic illustrations of idealized exemplary embodiments and/or intermediate structures. As such, variations from the shapes of the illustrations as a result, for example, of manufacturing techniques and/or tolerances, are to be expected. Thus, exemplary embodiments disclosed herein should not necessarily be construed as limited to the particular illustrated shapes of regions, but are to include deviations in shapes that result from, for instance, manufacturing. In this manner, regions illustrated in the drawings may be schematic in nature and the shapes of these regions may not reflect actual shapes of regions of a device and, as such, are not necessarily intended to be limiting.

As customary in the field, some exemplary embodiments are described and illustrated in the accompanying drawings in terms of functional blocks, units, and/or modules. Those skilled in the art will appreciate that these blocks, units, and/or modules are physically implemented by electronic (or optical) circuits, such as logic circuits, discrete components, microprocessors, hard-wired circuits, memory elements, wiring connections, and the like, which may be formed using semiconductor-based fabrication techniques or other manufacturing technologies. In the case of the blocks, units, and/or modules being implemented by microprocessors or other similar hardware, they may be programmed and controlled using software (e.g., microcode) to perform various functions discussed herein and may optionally be driven by firmware and/or software. It is also contemplated that each block, unit, and/or module may be implemented by dedicated hardware, or as a combination of dedicated hardware to perform some functions and a processor (e.g., one or more programmed microprocessors and associated circuitry) to perform other functions. Also, each block, unit, and/or module of some exemplary embodiments may be physically separated into two or more interacting and discrete blocks, units, and/or modules without departing from the scope of the inventive concepts. Further, the blocks, units, and/or modules of some exemplary embodiments may be physically combined into more complex blocks, units, and/or modules without departing from the scope of the inventive concepts.

Unless otherwise defined, all terms (including technical and scientific terms) used herein have the same meaning as commonly understood by one of ordinary skill in the art to which this disclosure is a part. Terms, such as those defined in commonly used dictionaries, should be interpreted as having a meaning that is consistent with their meaning in the context of the relevant art and should not be interpreted in an idealized or overly formal sense, unless expressly so defined herein.

Figure 1B:
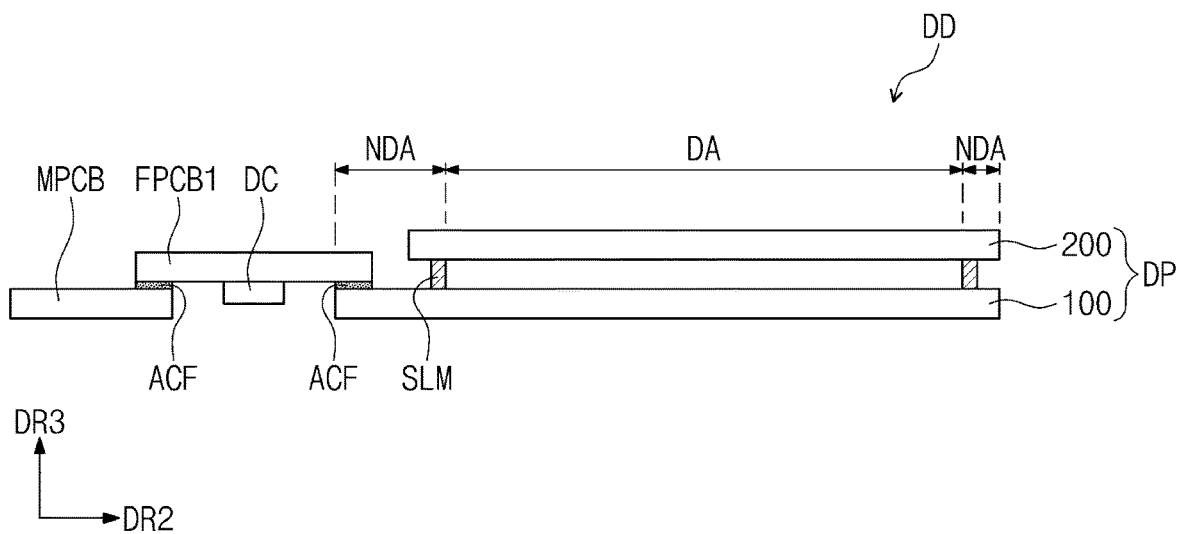
FIG. 1B is a cross-sectional view illustrating the display device according to an exemplary embodiment of the inventive concepts.
Figure 2:
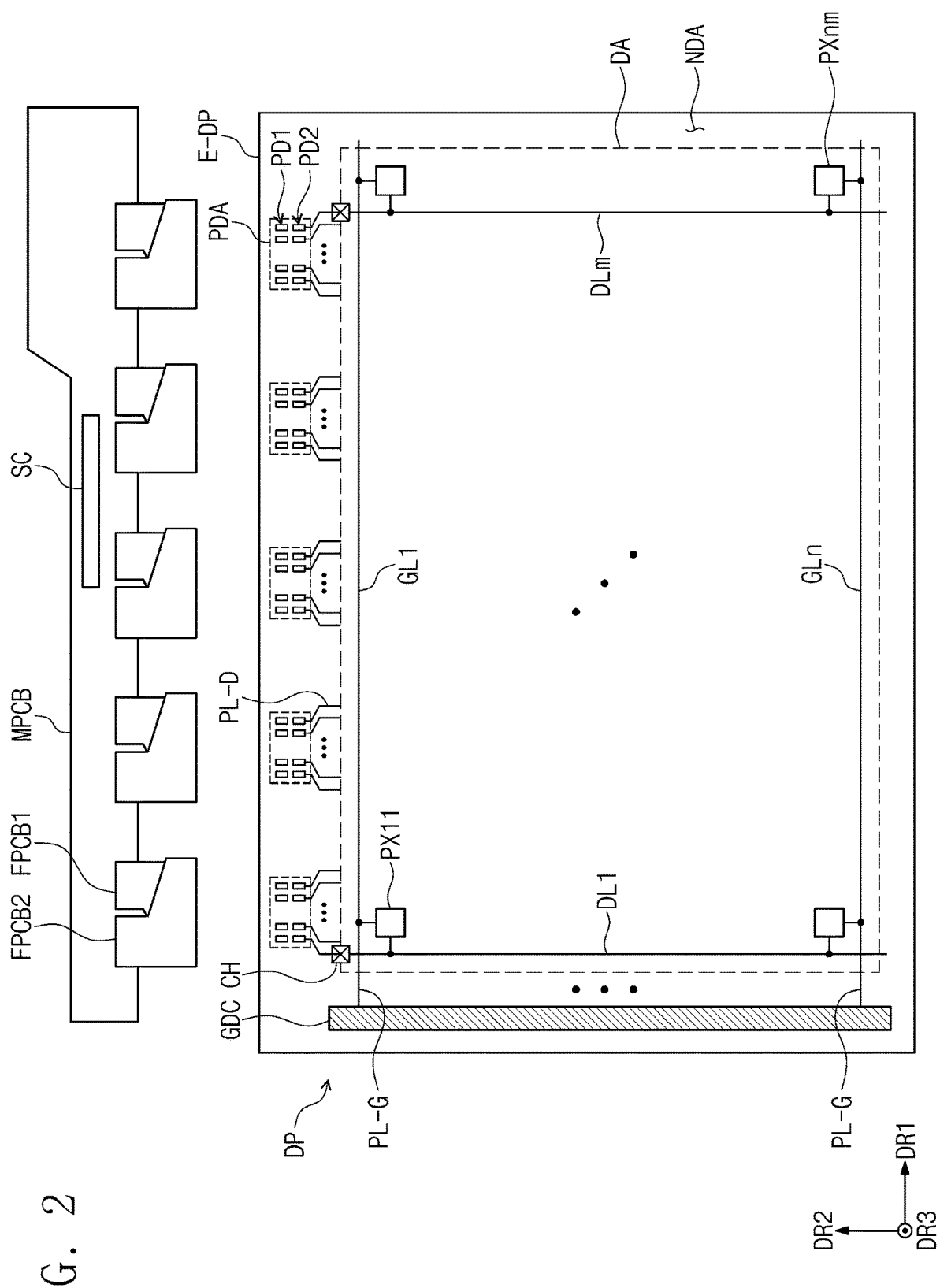
FIG. 2 is a plan view illustrating the display device according to an exemplary embodiment of the inventive concepts.

FIG. 1A is a perspective view illustrating a display device DD according to an exemplary embodiment of the inventive concepts. FIG. 1B is a cross-sectional view illustrating the display device DD according to an exemplary embodiment of the inventive concepts. FIG. 2 is a plan view illustrating the display device DD according to an exemplary embodiment of the inventive concepts.

Referring to FIG. 1A to 2, the display device DD includes a display panel DP, a connecting circuit board FPCB1 and FPCB2, and a main circuit board MPCB. Although a driving chip DC is mounted on the connecting circuit board FPCB1 and FPCB2 in the embodiment, exemplary embodiments of the inventive concepts are not limited thereto. For example, the driving chip DC may be mounted to the display panel DP or the main circuit board MPCB instead of being mounted to the connecting circuit board FPCB1 and FPCB2.

Although not separately shown, the display device DD may further include a chassis member or a molding member, and may further include a backlight unit according to a kind of display panel DP.

The display panel DP may be one of a liquid crystal display panel, a plasma display panel, an electrophoretic display panel, a microelectromechanical system display panel, an electrowetting display panel, and an organic light emitting display panel. However, exemplary embodiments of the inventive concepts are not limited thereto.

The display panel DP may include a first display substrate 100 and a second display substrate 200 spaced apart from the first display substrate 100 while facing the same. A predetermined cell cap may be defined between the first display substrate 100 and the second display substrate 200. The cell gap may be maintained by a sealant SLM that couples the first display substrate 100 to the second display substrate 200. A gray scale display layer may be disposed between the first display substrate 100 and the second display substrate 200. The gray scale display layer may include a liquid crystal layer, an organic light emitting layer, and an electrophoretic layer according to a kind of display panel.

As illustrated in FIG. 1A, the display device DD may display an image through a display surface DP-IS. The display surface DP-IS is parallel to a plane defined by a first directional axis DR1 and a second directional axis DR2. The display surface DP-IS may include a display area DA and a non-display area NDA. The non-display area NDA is defined along an edge of the display surface DP-IS. The display area DA may be surrounded by the non-display area NDA. In an exemplary embodiment of the inventive concepts, the non-display area NDA may be disposed on only one side area adjacent to the connecting circuit board FPCB1 and FPCB2.

A normal direction of the display surface DP-IS, i.e., a thickness direction of the display panel DP, indicates a third directional axis DR3. Hereinafter, a front surface (or top surface) and a rear surface (or bottom surface) of each of members or units are distinguished by the third directional axis DR3. However, the first to third directional axes DR1, DR2, and DR3 in the embodiments are exemplarily illustrated. Hereinafter, first to third directions may be directions indicated by the first to third directional axes DR1, DR2, and DR3 and designated by the same reference numerals, respectively.

Although the display panel DP having a planar-type display surface is illustrated, exemplary embodiments of the inventive concepts are not limited thereto. For example, the display device DD may include a curved-type display surface or a three dimensional-type display surface. The three-dimensional display surface may include a plurality of display areas indicating directions different from each other.

A signal control unit SC may be mounted to the main circuit board MPCB. The signal control unit SC receives image data and control signals from an external graphic control unit (not shown). The signal control unit SC may provide a control signal to the display panel DP.

The connecting circuit board FPCB1 and FPCB2 may be electrically connected to each of the display panel DP and the main circuit board MPCB. The connecting circuit board FPCB1 and FPCB2 may transmit a signal from the main circuit board MPCB to the driving chip DC and a signal from the driving chip DC to the display panel DP. In the embodiment, the driving chip DC may be a data driving circuit. In an exemplary embodiment of the inventive concepts, the connecting circuit board FPCB1 and FPCB2 may transmit a signal from the signal control unit SC to the display panel DP.

The connecting circuit board FPCB1 and FPCB2 may be connected to each of the display panel DP and the main circuit board MPCB by a conductive adhesion member. The conductive adhesion member may include an anisotropic conductive film ACF. Hereinafter, the conductive adhesion member will be described as the anisotropic conductive film ACF.

In the embodiment, the connecting circuit board FPCB1 and FPCB2 may include two kinds of circuit boards. The two kinds of connecting circuit boards FPCB1 and FPCB2 are connected to different pad rows disposed on one pad area PDA, respectively. Although the pad area PDA is disposed on the first display substrate 100 in the exemplary embodiment, exemplary embodiments of the inventive concepts are not limited thereto. In an exemplary embodiment of the inventive concepts, the pad area PDA may be disposed on the second display substrate 200.

FIG. 2 is a view illustrating a planar arrangement relationship between signal lines GL1 to GLn, DL1 to DLm, PL-G, and PL-D and pixels PX11 to PXnm. The signal lines GL1 to GLn, DL1 to DLm, PL-G, and PL-D may include a plurality of gate lines GL1 to GLn, a plurality of data lines DL1 to DLm, and auxiliary signal lines PL-G and PL-D.

The plurality of gate lines GL1 to GLn are arranged in the second direction DR2 while extending in the first direction DR1, and the plurality of data lines DL1 to DLm cross the plurality of gate lines GL1 to GLn in an insulating manner. The plurality of gate lines GL1 to GLn and the plurality of data lines DL1 to DLm overlap the display area DA. The auxiliary signal lines PL-G and PL-D overlap the non-display area NDA and are connected to the plurality of gate lines GL1 to GLn and the plurality of data lines DL1 to DLm.

First auxiliary signal lines PL-G connected to the plurality of gate lines GL1 to GLn may be arranged on the same layer as the plurality of gate lines GL1 to GLn to form an integrated shape. Although the plurality of gate lines GL1 to GLn and the first auxiliary signal lines PL-G are distinguished in the embodiment, exemplary embodiments of the inventive concepts are not limited thereto. For example, the gate line and the first auxiliary signal line, which are connected to each other, may be defined as one signal line. Here, the gate line and the first auxiliary signal line, which are connected to each other, may be defined as portions of one signal line, which are different from each other.

Second auxiliary signal lines PL-D connected to the data lines DL1 to DLm may be arranged on a different layer from the plurality of data lines DL1 to DLm. The data lines DL1 to DLm may be electrically connected to corresponding signal lines of the second auxiliary signal lines PL-D through a contact hole CH, respectively. The contact hole CH passes through at least one insulation layer disposed between the data lines DL1 to DLm and the second auxiliary signal lines PL-D. Two contact holes CH are exemplarily illustrated in FIG. 2.

In an exemplary embodiment of the inventive concepts, the contact hole CH may be omitted. The data lines DL1 to DLm and the second auxiliary signal lines PL-D may be arranged on the same layer. Here, data lines of the data lines DL1 to DLm, which are connected to the second auxiliary signal lines PL-D, and the second auxiliary signal lines PL-D may be defined as one signal line. Here, the data line and the second auxiliary signal line, which are connected to each other, may be defined as portions of one signal line, which are different from each other.

The pixels PX11 to PXnm are connected to corresponding gate lines of the plurality of gate lines GL1 to GLn and corresponding data lines of the plurality of data lines DL1 to DLm, respectively. Each of the pixels PX11 to PXnm may include a pixel driving circuit and a display element.

Although the pixels PX11 to PXnm in a matrix form are exemplarily illustrated, exemplary embodiments of the inventive concepts are not limited thereto. For example, the pixels PX11 to PXnm may be arranged in a pentile form. Also, the pixels PX11 to PXnm may be arranged in a diamond form.

As illustrated in FIG. 2, two pad rows PD1 and PD2 are arranged on each of the pad areas PDA. Each of the two pad rows PD1 and PD2 includes a plurality of pads arranged in the first direction DR1. A first pad row PD1 and a second pad row PD2 are spaced apart from each other in a direction crossing the first direction. In the second direction DR2, the second pad row PD2 is spaced further from an edge E-DP of the display panel DP and disposed more adjacent to the display area DA than the first pad row PD1. The first pad row PD1 and the second pad row PD2 are connected to the second auxiliary signal lines PL-D, respectively.

A gate driving circuit GDC may be integrated into the display panel DP through an oxide silicon gate driver circuit (OSG) or amorphous silicon gate driver circuit (ASG) process. The first auxiliary signal lines PL-G receive a gate signal from the gate driving circuit GDC.

Figure 3A:
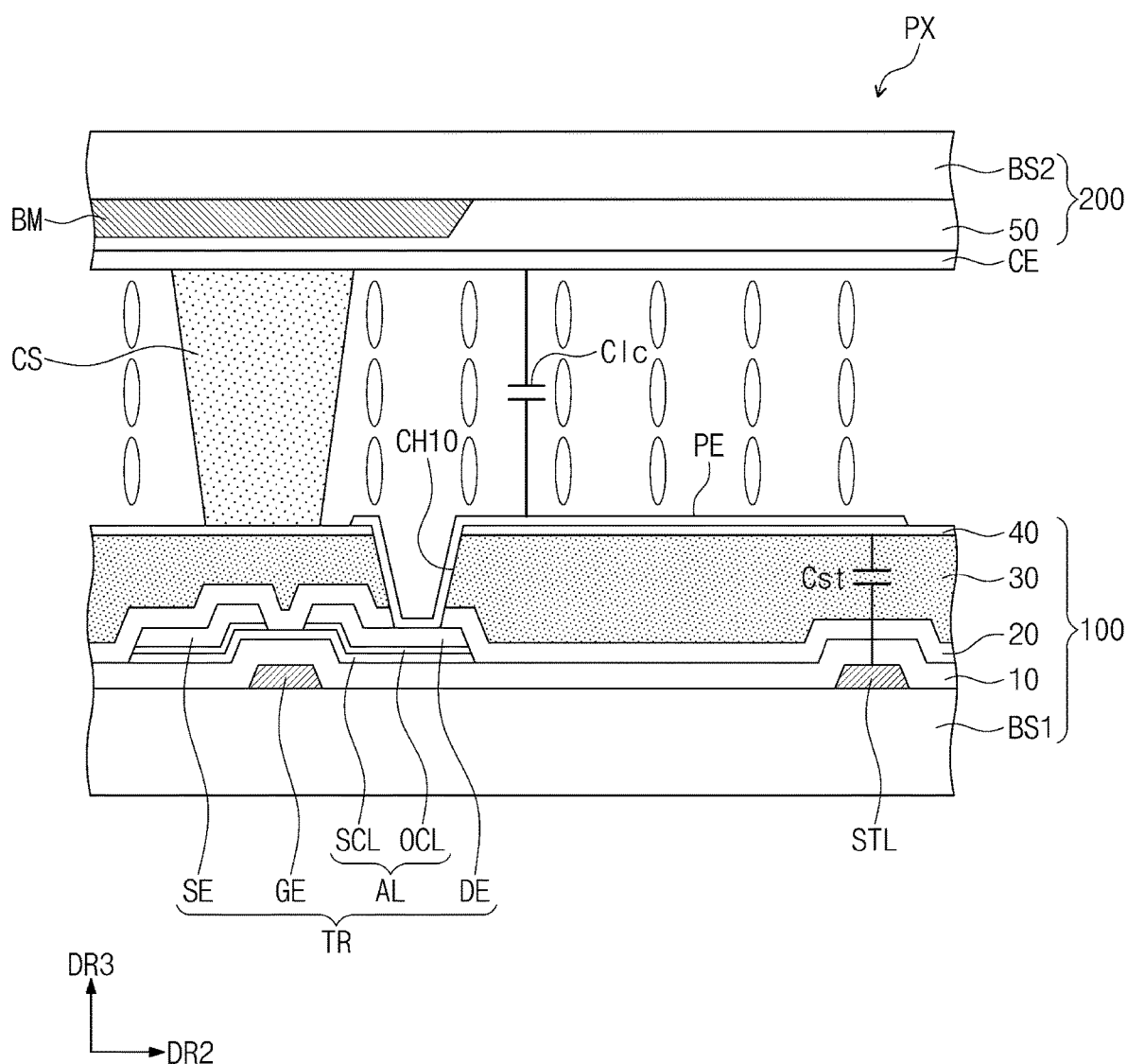
FIGS. 3A and 3B are cross-sectional views illustrating a display panel according to an exemplary embodiment of the inventive concepts.
Figure 3B:
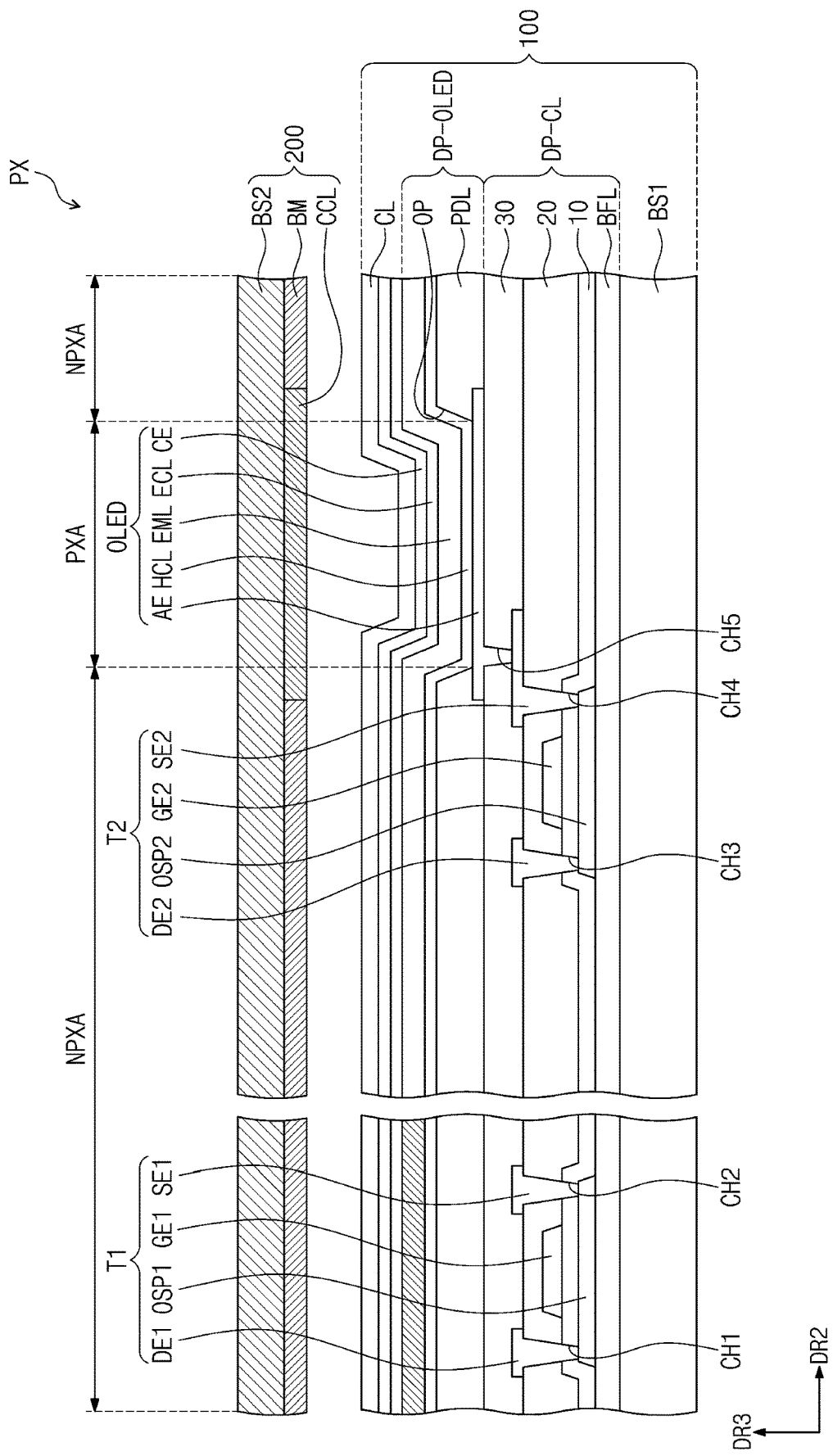

FIGS. 3A and 3B are cross-sectional views illustrating the display area DA of the display panel DP according to an exemplary embodiment of the inventive concepts. FIG. 3A illustrates a cross-section corresponding to the pixel PX of the liquid crystal display panel, and FIG. 3B illustrates a cross-section corresponding to the pixel PX of the organic light emitting display panel.

The pixel PX of the liquid crystal display panel may include a transistor TR, a liquid crystal capacitor Clc, and a storage capacitor Cst.

The transistor TR includes a control electrode GE connected to the gate line, an activation part AL overlapping the control electrode GE, an input electrode SE connected to the data line, and an output electrode DE spaced apart from the input electrode SE. The liquid crystal capacitor Clc includes a pixel electrode PE and a common electrode CE. The storage capacitor Cst includes the pixel electrode PE and a portion of a storage line STL overlapping the pixel electrode PE.

The gate electrode GE and the storage line STL are disposed on one surface of a first base substrate BS1. The first base substrate BS1 may be a glass substrate or a plastic substrate. A first insulation layer 10 covering the control electrode GE and the storage line STL is disposed on one surface of the first base substrate BS1. The first insulation layer 10 may contain at least one of an inorganic material and an organic material. The activation part AL is overlapping the control electrode GE is disposed on the first insulation layer 10. The activation part AL may include a semiconductor layer SCL and an ohmic contact layer OCL. The semiconductor layer SCL is disposed on the first insulation layer 10, and the ohmic contact layer OCL is disposed on the semiconductor layer SCL.

The semiconductor layer SCL may contain amorphous silicon or polysilicon. Alternatively, the semiconductor layer SCL may include a metallic oxide semiconductor. The ohmic contact layer OCL may include a dopant that is doped with a high density more than that of the semiconductor layer. The ohmic contact layer OCL may include two portions that are spaced apart from each other. In an exemplary embodiment of the inventive concepts, the ohmic contact layer OCL may have an integrated shape.

The output electrode DE and the input electrode SE are disposed on the activation part AL. The output electrode DE and the input electrode SE are spaced apart from each other. A second insulation layer 20 covering the activation part AL, the output electrode DE, and the input electrode SE is disposed on the first insulation layer 10. A third insulation layer 30 is disposed on the second insulation layer 20. Each of the second insulation layer 20 and the third insulation layer 30 may contain at least one of an inorganic material and an organic material. The third insulation layer 30 is disposed on the second insulation layer 20. The third insulation layer 30 may be a single layered organic layer that provides a flat surface. In the embodiment, the third insulation layer 30 may include a plurality of color filters. A fourth insulation layer 40 is disposed on the third insulation layer 30. The fourth insulation layer 40 may be an inorganic layer covering the color filters.

As illustrated in FIG. 3A, the pixel electrode PE is disposed on the fourth insulation layer 40. The pixel electrode PE is connected to the output electrode DE through a contact hole CH10 passing through the second insulation layer 20, the third insulation layer 30, and the fourth insulation layer 40. An orientation layer (not shown) covering the pixel electrode PE may be disposed on the fourth insulation layer 40.

A second base substrate BS2 may be a glass substrate or a plastic substrate. A black matrix layer BM is disposed on a bottom surface of the second base substrate BS2. That is, openings corresponding to the pixel areas may be defined in the black matrix layer BM. A spacer CS may be disposed to overlap the black matrix layer BM.

Insulation layers covering the black matrix layer BM is disposed on the bottom surface of the second base substrate BS2. A fifth insulation layer 50 providing a flat surface is exemplarily illustrated in FIG. 3A. The fifth insulation layer 50 may contain an organic material.

As illustrated in FIG. 3A, the common electrode CE is disposed on the bottom surface of the second base substrate BS2. A common voltage is applied to the common electrode CE. The common voltage has a value different from that of a pixel voltage.

The cross-section of the pixel PX is intended to be illustrative in FIG. 3A. The first display substrate 100 and the second display substrate 200 may be turned over in the third direction DR3. The color filters may be disposed on the second display substrate 200.

Referring to FIG. 3A, although the liquid crystal display panel in a vertical alignment (VA) mode is exemplarily described, a liquid crystal display panel in a in-plane switching (IPS) mode, a fringe-field switching (FFS) mode, a plane to line switching (PLS) mode, a super vertical alignment (SVA) mode, or a surface-stabilized vertical alignment (SS-VA) mode may be applied in an exemplary embodiment of the inventive concepts.

As illustrated in FIG. 3B, the pixel PX of the organic light emitting display panel may include a switching transistor T1, a driving transistor T2, and a light emitting element OLED.

The organic light emitting display panel includes a display substrate 100 as the first display substrate and an encapsulation substrate 200 as the second display substrate. The display substrate 100 includes a first base substrate BS1, a circuit element layer DP-CL disposed on the first base substrate BS1, a display element layer DP-OLED disposed on the circuit element layer DP-CL, and a cover layer CL disposed on the display element layer DP-OLED. The encapsulation substrate 200 may include a second base substrate BS2, a black matrix layer BM disposed on the second base substrate BS2, and a color converting layer CCL.

The first base substrate BS1 may include a synthetic resin substrate or a glass substrate. The circuit element layer DP-CL includes at least one insulation layer and a circuit element. The circuit element includes a signal line, a driving circuit of a pixel, or the like. The circuit element layer DP-CL may be formed through a process of forming an insulation layer, a semiconductor layer, and a conductive layer by coating or deposition and a process of patterning the insulation layer, the semiconductor layer, and the conductive layer by a photolithography process.

In the embodiment, the circuit element layer DP-CL may include a buffer layer BFL, a first insulation layer 10, a second insulation layer 20, and a third insulation layer 30. Each of the first insulation layer 10 and the second insulation layer 20 may be an inorganic layer, and the third insulation layer 30 may be an organic layer.

FIG. 3 exemplarily illustrates an arrangement relationship between a first semiconductor pattern OSP1, a second semiconductor pattern OSP2, a first control electrode GE1, a second control electrode GE2, a first input electrode DE1, a first output electrode SE1, a second input electrode DE2, and a second output electrode SE2, which constitute the switching transistor T1 and the driving transistor T2. First to fourth through-holes CH1, CH2, CH3, and CH4 are also exemplarily illustrated.

The display element layer DP-OLED includes the light emitting element OLED. The display element layer DP-OLED may include an organic light emitting diode as a light emitting element. The display element layer DP-OLED includes a pixel defining layer PDL. For example, the pixel defining layer PDL may be an organic layer.

A first electrode AE is disposed on the third insulation layer 30. The first electrode AE is connected to the second output electrode SE2 through a fifth contact hole CH5 passing through the third insulation layer 30. An opening OP is defined in the pixel defining layer PDL. The opening OP of the pixel defining layer PDL exposes at least a portion of the first electrode AE. The opening OP of the pixel defining layer PDL is referred to as a light emitting opening to be distinguished from other openings.

As illustrated in FIG. 3B, the display panel DP may include a light emitting area PXA and a non-light emitting area NPXA disposed adjacent to the light emitting area PXA. The non-light emitting area NPXA may surround the light emitting area PXA. In the embodiment, the light emitting area PXA is defined in correspondence to a partial area of the first electrode AE, which is exposed by the light emitting opening OP.

A hole control layer HCL may be disposed in the light emitting area PXA and the non-light emitting area NPXA in common. The hole control layer HCL may include a hole transporting layer and further include a hole injection layer. A light emitting layer EML is disposed on the hole control layer HCL. The light emitting layer EML may be disposed in the light emitting area PXA and the non-light emitting area NPXA in common. In an exemplary embodiment of the inventive concepts, the light emitting layer EML may be disposed in the light emitting area PXA and may not be disposed in the non-light emitting area NPXA. The light emitting layer EML may contain an organic material and/or an inorganic material. The light emitting layer EML may generate predetermined first color light, e.g., blue light.

An electron control layer ECL is disposed on the light emitting layer EML. The electron control layer ECL may further include an electron transporting layer and further include an electron injection layer. The hole control layer HCL and the electron control layer ECL may be provided in the plurality of pixels in common by using an open mask. A second electrode CE is disposed on the electron control layer ECL. The second electrode CE is disposed in the plurality of pixels in common. The cover layer CL, which protects the second electrode CE, may be disposed on the second electrode CE. The cover layer CL may contain an organic material or an inorganic material.

The second base substrate BS2 may be spaced apart from the cover layer CL. The second base substrate BS2 may include a synthetic resin substrate or a glass substrate. The color converting layer CCL may transmit first color light or covert the first color light into second color light or third color light according to the pixel PX. The color converting layer CCL may include a quantum dot.

In an exemplary embodiment of the inventive concepts, the encapsulation substrate 200 may be replaced by a thin-film encapsulation layer. Here, the black matrix layer BM and the color converting layer CCL may be disposed on the thin-film encapsulation layer.

Figure 4A:
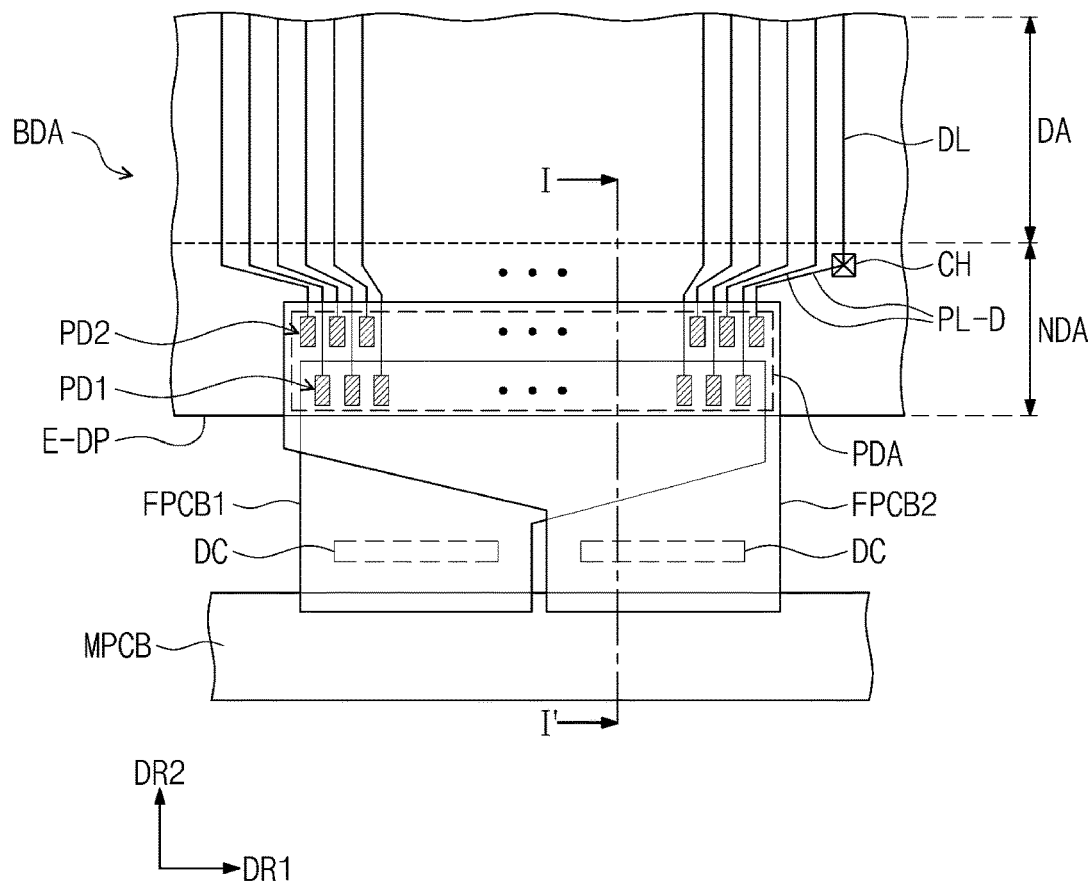
FIG. 4A is an enlarged plan view illustrating the display device according to an exemplary embodiment of the inventive concepts.
Figure 4B:
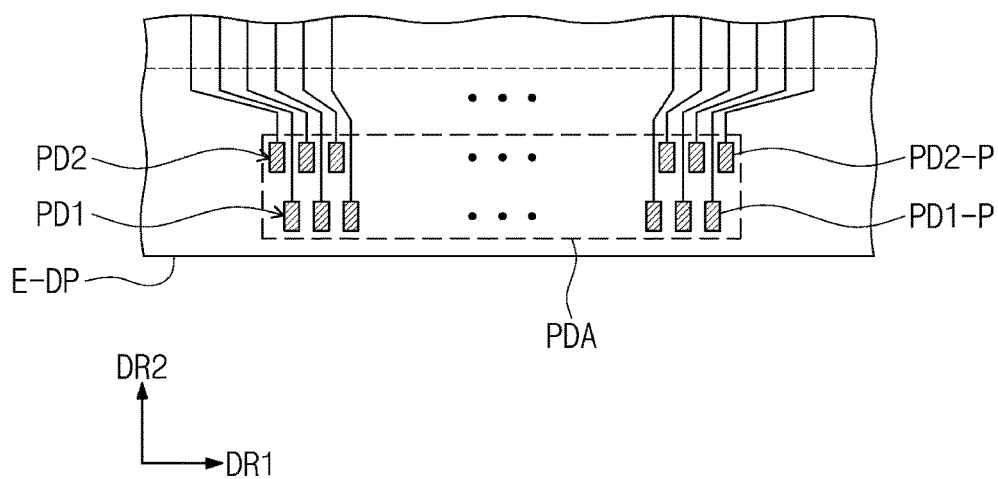
FIG. 4B is an enlarged plan view illustrating the display panel according to an exemplary embodiment of the inventive concepts.
Figure 4C:
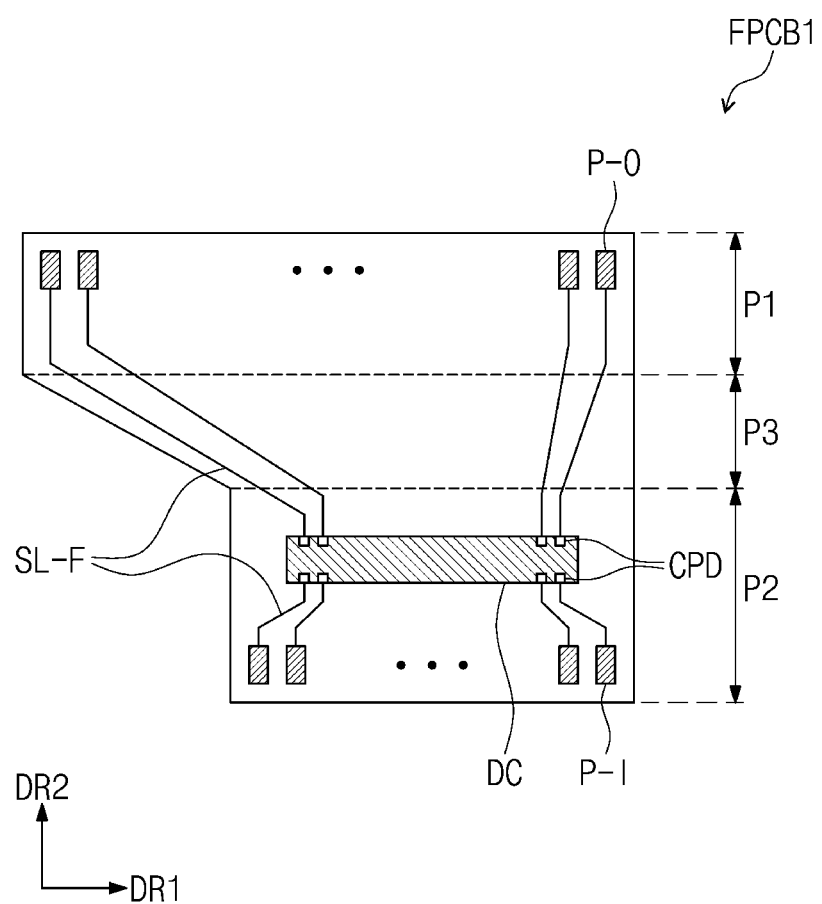
FIG. 4C is a rear view illustrating a connecting circuit board according to an exemplary embodiment of the inventive concepts.

FIG. 4A is an enlarged plan view illustrating the display device DD according to an exemplary embodiment of the inventive concepts. FIG. 4B is an enlarged plan view illustrating the display panel DP according to an exemplary embodiment of the inventive concepts. FIG. 4C is a rear view illustrating a connecting circuit board FPCB1 according to an exemplary embodiment of the inventive concepts.

Hereinafter, an area in which the pad area PDA of the display panel DP is electrically connected to the connecting circuit board FPCB1 and FPCB2 is defined as a bonding area BDA of the display device DD. An output pad of the connecting circuit board FPCB1 and FPCB2 overlaps the pad area PDA of the display panel DP.

As illustrated in FIGS. 4A and 4B, a first pad row PD1 and a second pad row PD2, which form different rows, are disposed on the pad area PDA. The first pad row PD1 includes a plurality of first pads PD1-P, and the second pad row PD2 includes a plurality of second pads PD2-P. The first connecting circuit board FPCB1 is electrically connected to the first pad row PD1, and the second connecting circuit board FPCB2 is electrically connected to the second pad row PD2.

The first connecting circuit board FPCB1 and the second connecting circuit board FPCB2 have extremely similar structures although partially different in sizes and shapes. FIG. 4C exemplarily illustrates the first connecting circuit board FPCB1. Each of the first connecting circuit board FPCB1 and the second connecting circuit board FPCB2 includes an insulation layer (not shown), a plurality of pads CPD, P-O, and P-I, and a plurality of signal lines SL-F. The plurality of pads CPD, P-O, and P-I and the plurality of signal lines SL-F are disposed on the insulation layer. The insulation layer may include a polyimide layer.

The plurality of pads CPD, P-O, and P-I may include connection pads CPD connected to connection terminals of the driving chip DC, first pads (P-O, hereinafter, referred to as output pads) connected to the display panel DP, and second pads (P-I, hereinafter, referred to as input pads) connected to the main circuit board. The plurality of signal lines SL-F connect the connection pads CPD to the output pads P-O and the connection pads CPD to the input pads P-I. When the driving chip DC is omitted, the signal lines SL-F may connect the output pads P-O to the input pads P-I.

Each of the first connecting circuit board FPCB1 and the second connecting circuit board FPCB2 may further include a solder resist layer. The solder resist layer exposes each of the plurality of pads CPD, P-O, and P-I while further covering a peripheral area of each of the plurality of pads CPD, P-O, and P-I. Openings corresponding to the plurality of pads CPD, P-O, and P-I may be defined in the solder resist layer.

Each of the first connecting circuit board FPCB1 and the second connecting circuit board FPCB2 may include three portions that are distinguished according to widths in the first direction. The three portions may include a first portion P1 on which the output pads P-O are disposed, a second portion P2 in which the input pads P-I are disposed, and a third portion P3 that connects the first portion P1 to the second portion P2. The first portion P1 may have a width greater than that of the second portion P2. The third portion P3 may have a width that gradually decreases in a direction from the first portion P1 to the second portion P2. The driving chip DC may be mounted to the second portion P2.

As illustrated in FIG. 4A, the first portion P1 of the first connecting circuit board FPCB1 and the first portion of the second connecting circuit board FPCB2 may overlap each other. The second connecting circuit board FPCB2 may have an area greater than that of the first connecting circuit board FPCB1, and the first portion P1 of the first connecting circuit board FPCB1 may be disposed inside the first portion of the second connecting circuit board FPCB2 on a plane. The third portion P3 of the first connecting circuit board FPCB1 may not overlap the third portion of the second connecting circuit board FPCB2. Accordingly, the second portion P2 of the first connecting circuit board FPCB1 and the second portion of the second connecting circuit board FPCB2, which are connected to the main circuit board MPCB, are spaced apart from each other on a plane.

Figure 5A:
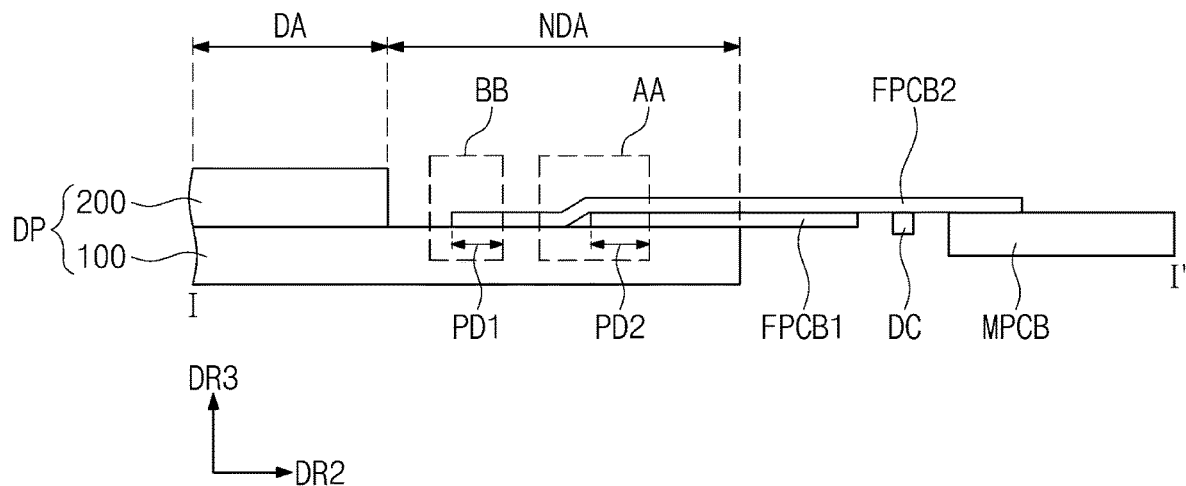
FIG. 5A is a cross-sectional view illustrating the display device according to an exemplary embodiment of the inventive concepts.
Figure 5B:
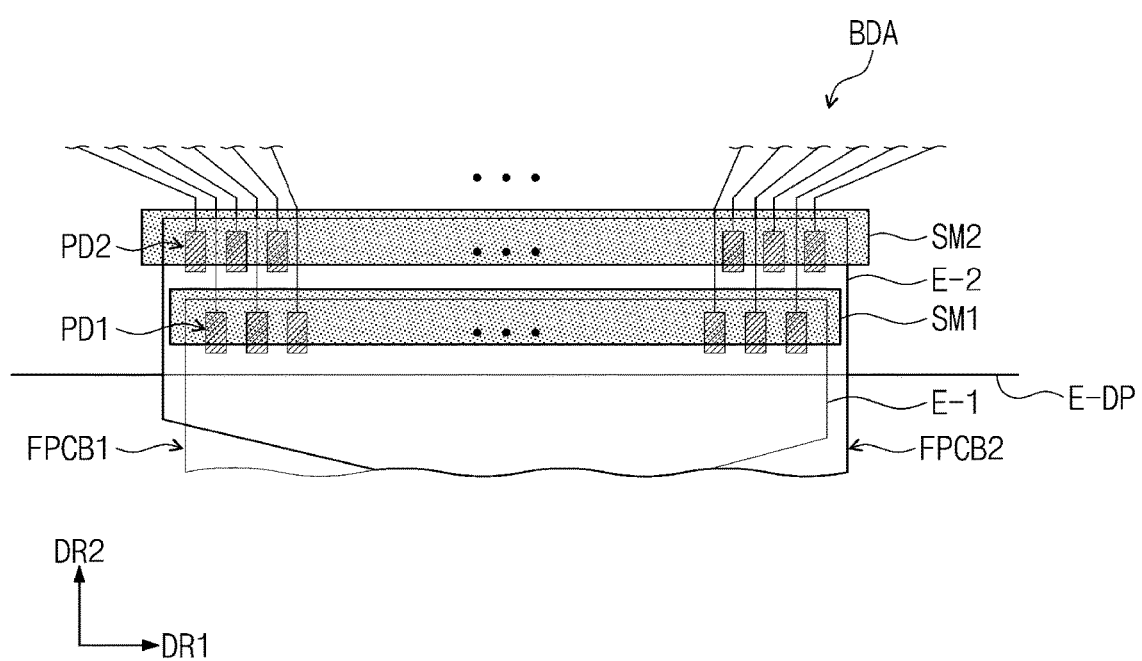
FIG. 5B is an enlarged plan view illustrating a bonding area of the display device according to an exemplary embodiment of the inventive concepts.
Figure 5C:
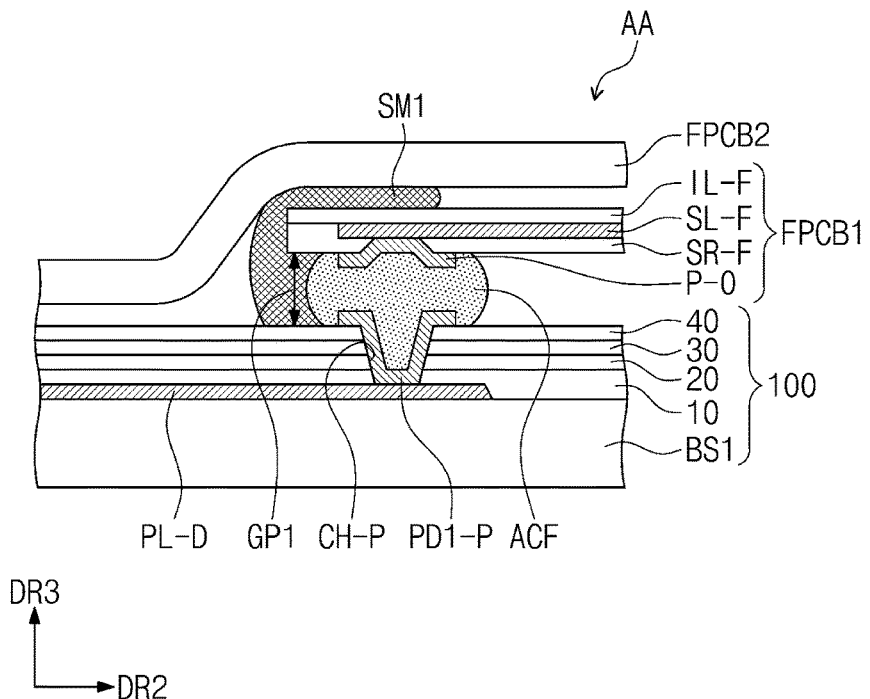
FIGS. 5C and 5D are enlarged cross-sectional views illustrating a region AA of FIG. 5A.
Figure 5D:
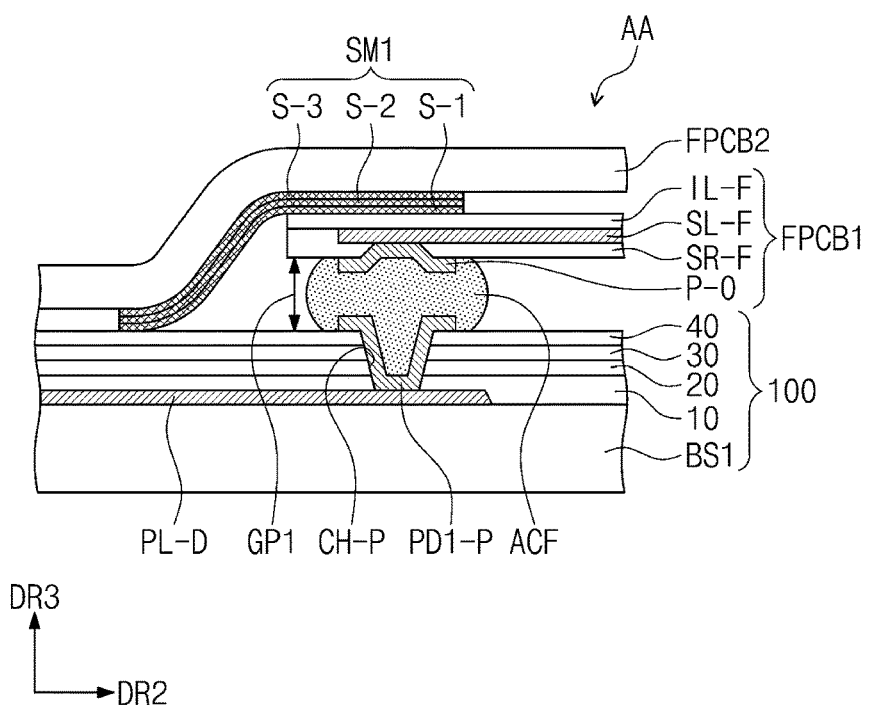
Figure 5E:
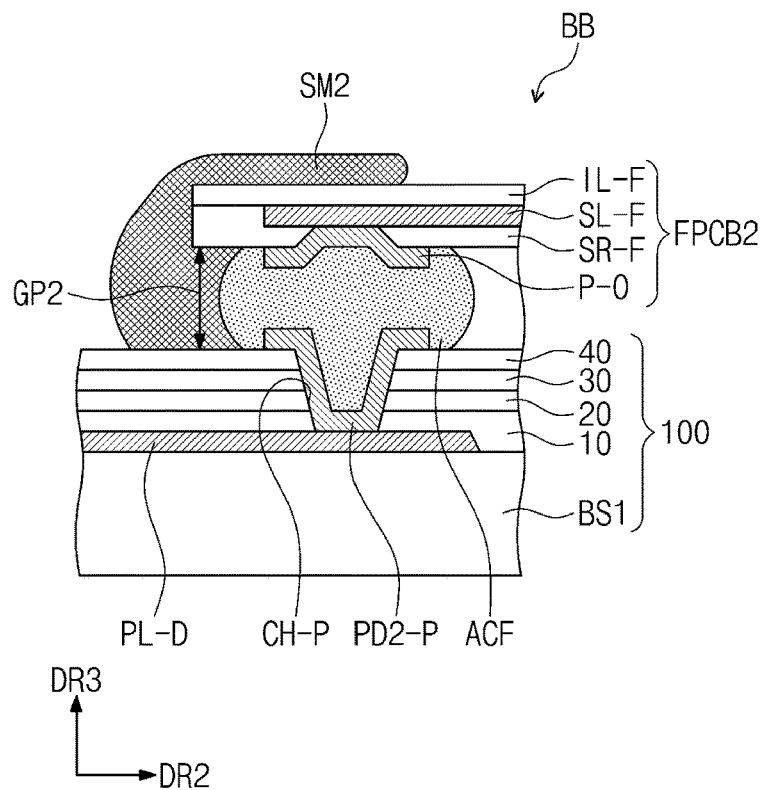
FIG. 5E is an enlarged cross-sectional view illustrating a region BB of FIG. 5A.
Figure 5F:
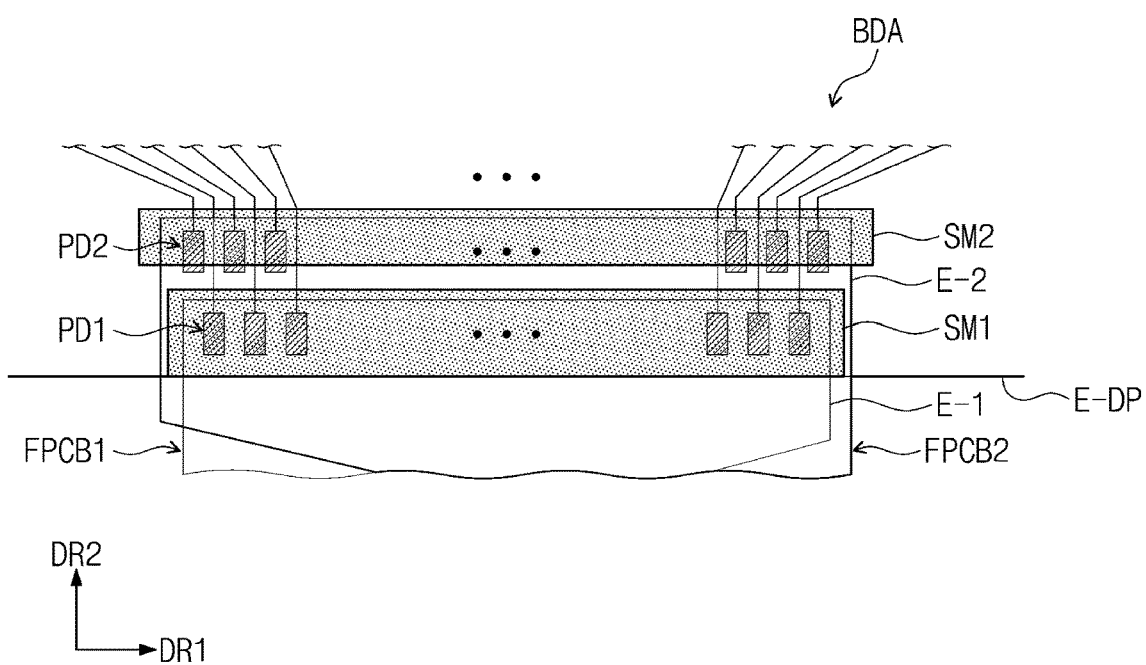
FIGS. 5F and 5G are enlarged plan views illustrating the display device according to an exemplary embodiment of the inventive concepts.
Figure 5G:
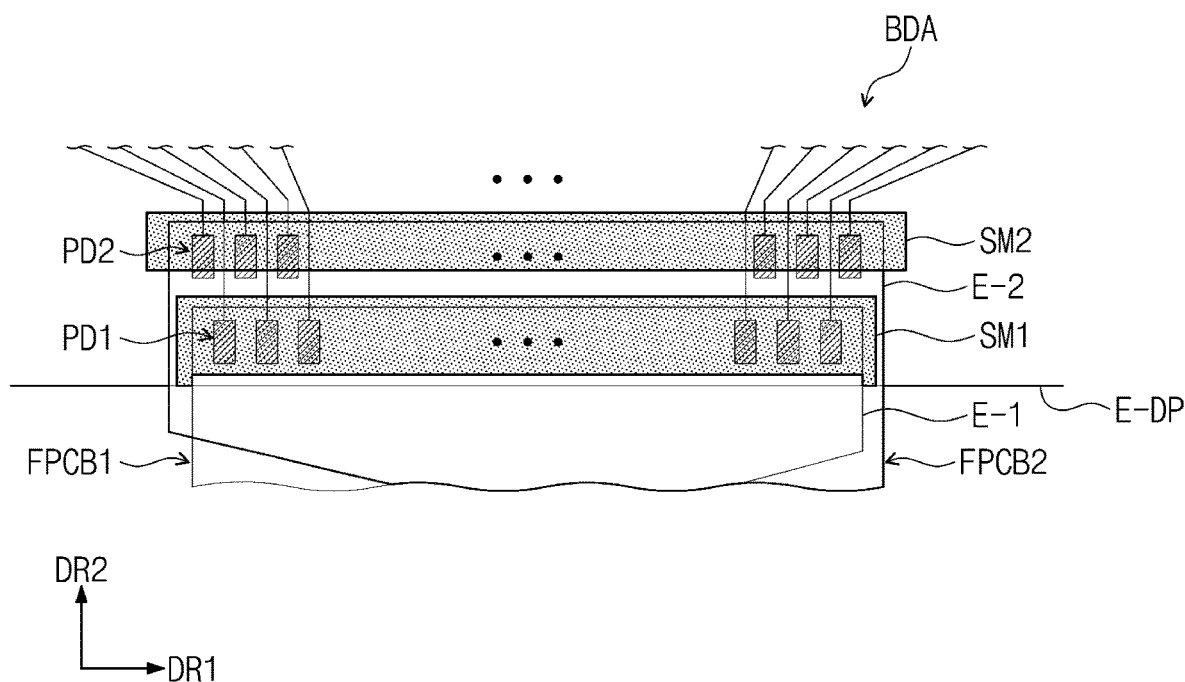

FIG. 5A is an enlarged cross-sectional view illustrating the display device DD according to an exemplary embodiment of the inventive concepts. FIG. 5B is an enlarged plan view illustrating the bonding area BDA of the display device DD according to an exemplary embodiment of the inventive concepts. FIGS. 5C and 5D are enlarged cross-sectional views illustrating a region AA of FIG. 5A. FIG. 5E is an enlarged cross-sectional view illustrating a region BB of FIG. 5A. FIGS. 5F and 5G are enlarged plan views illustrating the bonding area BDA of the display device according to an exemplary embodiment of the inventive concepts.

As illustrated in FIG. 5A, the second connecting circuit board FPCB2 is disposed above the first connecting circuit board FPCB1. The first connecting circuit board FPCB1 is connected to the first pad row PD1, and the second connecting circuit board FPCB2 is connected to the second pad row PD2.

As illustrated in FIG. 5B, a first sealing member SM1 is disposed adjacent to the first pad row PD1. The first sealing member SM1 may overlap the first pad row PD1 on a plane. The first sealing member SM1 may cover an edge E-1 of the first connecting circuit board FPCB1 on the plane. The covered edge may correspond to the first portion P1 (refer to FIG. 4C). A portion of the edge E-1 of the first portion P1, which extends in the first direction DR1, may be completely covered. A portion of the edge E-1 of the first portion P1, which extends in the second direction DR2, may be partially covered.

A second sealing member SM2 is disposed adjacent to the second pad row PD2. The second sealing member SM2 may overlap the second pad row PD2 on a plane. The second sealing member SM2 may cover an edge E-2 of the second connecting circuit board FPCB2 on the plane. The covered edge may correspond to the first portion P1 (refer to FIG. 4C). A portion of the edge E-2 of the first portion P1, which extends in the first direction DR1, may be completely covered. A portion of the edge E-2 of the first portion P1, which extends in the second direction DR2, may be partially covered.

FIG. 5C illustrates the first display substrate 100 with respect to the liquid crystal display panel in FIG. 3A. A first pad PD1-P is connected to an auxiliary signal line PL-D through a contact hole CH-P passing through first to fourth insulation layers 10 to 40. The first pad PD1-P is exposed from the first to fourth insulation layers 10 to 40. When the first pad PD1-P is omitted, an end of the auxiliary signal line PL-D may be exposed from the first to fourth insulation layers 10 to 40.

In FIG. 5C, the first connecting circuit board FPCB1 including an insulation layer IL-F, a signal line SL-F, a solder resist layer SR-F, and an output pad P-O is exemplarily illustrated. The second connecting circuit board FPCB2 is simply illustrated. The output pad P-O exposed from the solder resist layer SR-F is electrically connected to the first pad PD1-P through an anisotropic conductive film ACF.

As illustrated in FIG. 5C, a first sealing member SM1 is disposed between the first connecting circuit board FPCB1 and the second connecting circuit board FPCB2 to seal a first gap GP1 between the first connecting circuit board FPCB1 and the fourth insulation layer 40. A portion of the first sealing member SM1 may be filled into the first gap GP1. With reference to FIG. 5C, moisture that is permeated toward the first pad PD1-P from a left side of the first sealing member SM1 may be blocked by the first sealing member SM1. The first sealing member SM1 may attach the first connecting circuit board FPCB1 to the fourth insulation layer 40.

The first sealing member SM1 may contain a synthetic resin. The first sealing member SM1 may contain a silicon resin having excellent moisture resistance.

As illustrated in FIG. 5D, the first sealing member SM1 may have a multilayer structure. In the embodiment, the first sealing member SM1 may be a double-sided attachment tape or a double-sided adhesive tape.

The first sealing member SM1 may include a first adhesion layer S-1 attached to the first connecting circuit board FPCB1, a base layer S-2 disposed on the first adhesion layer S-1, and a second adhesion layer S-3 disposed on the base layer S-2 and attached to the second connecting circuit board FPCB2. The base layer S-2 may be a typical synthetic resin layer, and the first adhesion layer S-1 and the second adhesion layer S-3 may include a typical binder. The base layer S-2 may include a silicon film having excellent moisture resistance. The base layer S-2 may include a polyethylene terephthalate (PET) film. In an exemplary embodiment of the inventive concepts, one of the first and second adhesion layers S-1 and S-3 may be omitted.

In an exemplary embodiment of the inventive concepts, the first sealing member SM1 may be an adhesive tape excluding the base layer. The first sealing member SM1 may include a high molecular adhesion layer and a low molecular acrylic adhesion layer disposed on both surfaces of the high molecular adhesion layer.

Unlike the first sealing member SM1 that is simply illustrated in FIG. 5D, a boundary between the first adhesion layer S-1, the base layer S-2, and the second adhesion layer S-3 of the thermally deformed first sealing member SM1 may be unclear. A portion of the first sealing member SM1 may be filled into the first gap GP1.

As illustrated in FIG. 5E, a second pad PD2-P is connected to an auxiliary signal line PL-D through a contact hole CH-P passing through first to fourth insulation layers 10 to 40. FIG. 5E illustrates the second connecting circuit board FPCB2 having a cross-sectional structure that is similar to that of the first connecting circuit board FPCB1. An output pad P-O exposed from a solder resist layer SR-F is electrically connected to the second pad PD2-P through an anisotropic conductive film ACF.

As illustrated in FIG. 5E, the second sealing member SM2 seals a second gap GP2 between the second connecting circuit board FPCB2 and the fourth insulation layer 40. A portion of the second sealing member SM2 may be filled into the second gap GP2. With reference to FIG. 5E, moisture that is permeated toward the second pad PD2-P from a left side of the second sealing member SM2 may be blocked by the second sealing member SM2. The second sealing member SM2 may include the same material as the first sealing member SM1 in FIG. 5C. The second sealing member SM2 may contain a synthetic resin. The second sealing member SM2 may contain a silicon resin having excellent moisture resistance.

The second sealing member SM2 may have a thickness greater than that of the first sealing member SM1. The second sealing member SM2 has the greater thickness because the second sealing member SM2 is cured while being exposed to the outside, unlike the first sealing member SM1 that is compressed by the second connecting circuit board FPCB2.

As illustrated in FIGS. 5F and 5G, the first sealing member SM1 may be variously changed in shape. As illustrated in FIGS. 5F and 5G, the first sealing member SM1 may completely cover an area overlapping the first display substrate 100 of the edge E-1 of the first connecting circuit board FPCB1.

With reference to FIGS. 5F and 5G, moisture that is permeated toward the first pad PD1-P from left, right, and top sides of the first sealing member SM1 may be blocked by the first sealing member SM1. As illustrated in FIG. 5F, the first sealing member SM1 may completely cover a partial area of the first connecting circuit board FPCB1, which overlaps the first display substrate 100. As illustrated in FIG. 5G, the first sealing member SM1 may not cover a partial area of the first connecting circuit board FPCB1, which overlaps the first display substrate 100.

FIGS. 6A to 6E are an enlarged plan views illustrating the bonding area BDA of the display device DD according to an exemplary embodiment of the inventive concepts. FIGS. 6A to 6E are illustrated with reference to two bonding areas BDA.

Figure 6A:
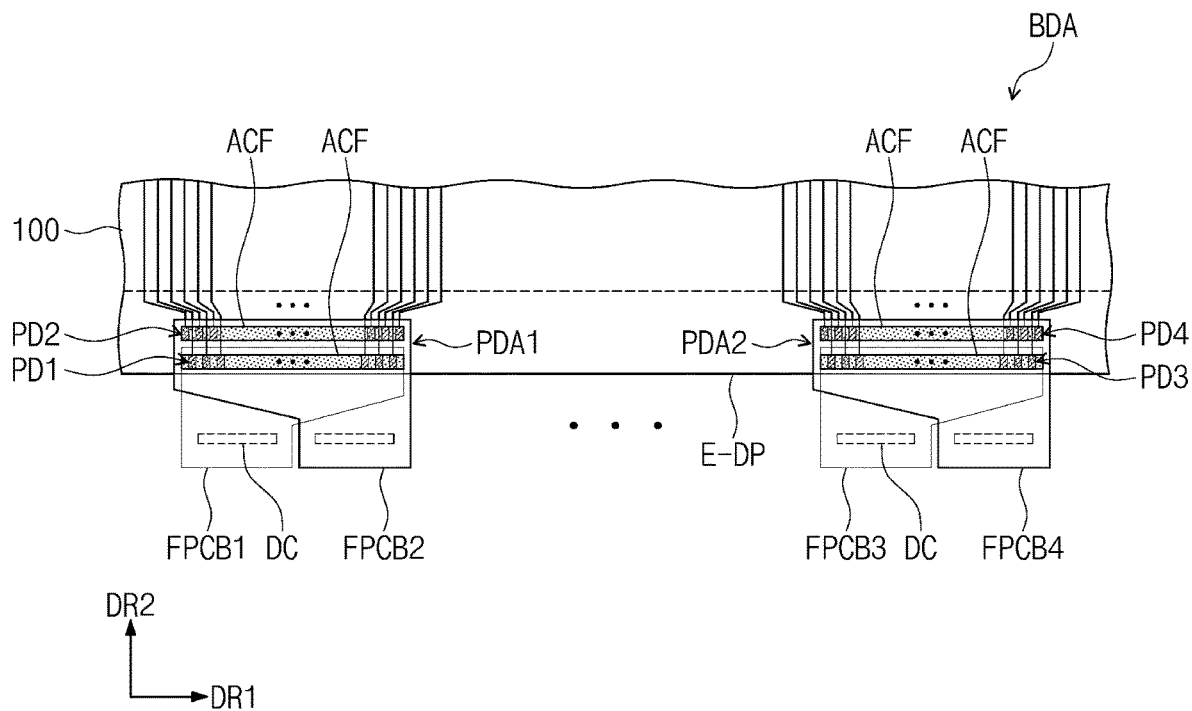
FIGS. 6A, 6B, 6C, 6D, and 6E are enlarged plan views illustrating the bonding area of the display device according to an exemplary embodiment of the inventive concepts.
Figure 6B:
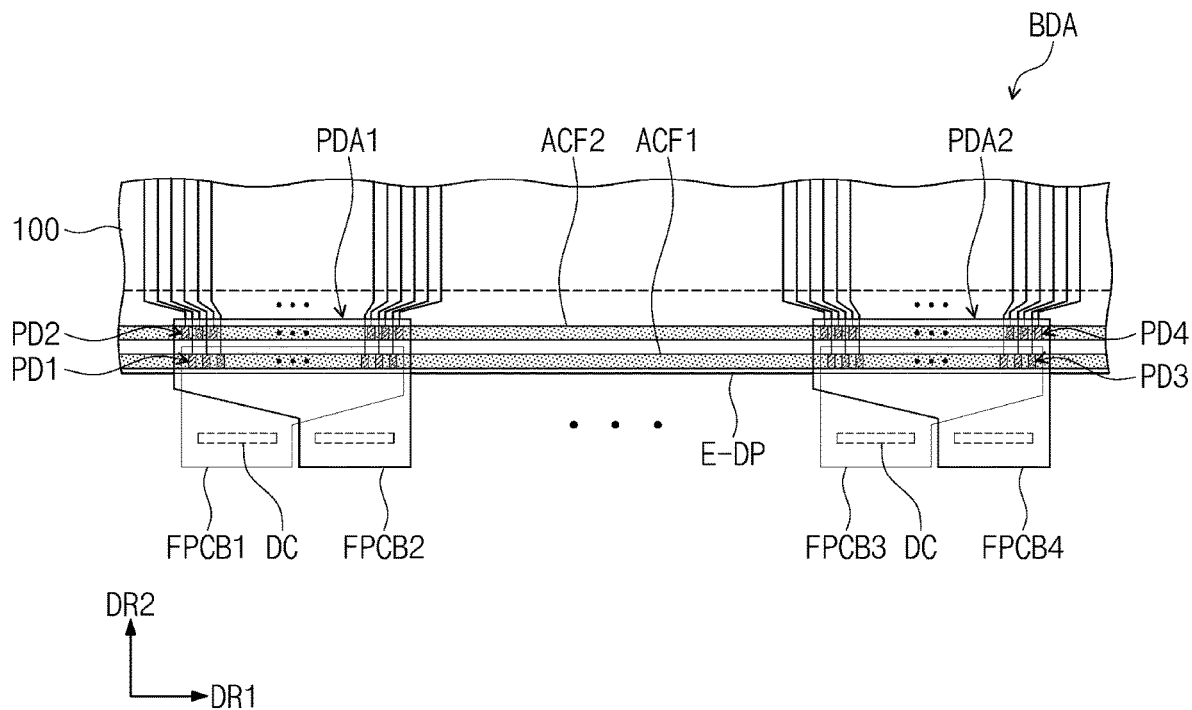

FIGS. 6A and 6B comparatively illustrate shapes of anisotropic conductive films. As illustrated in FIG. 6A, the anisotropic conductive film ACF may be independently disposed on each of the first to fourth pad rows PD1, PD2, PD3, and PD4 of the first and second pad areas PDA1 and PDA2. The anisotropic conductive films ACF may be separated from each other. The first and second connecting circuit boards FPCB1 and FPCB2 are connected to the first pad area PDA1, and the third and fourth connecting circuit boards FPCB3 and FPCB4 are connected to the second pad area PDA2.

As illustrated in FIG. 6B, a first anisotropic conductive film ACF1 may be disposed in common on the first pad row PD1 of the first pad area PDA1 and the third pad row PD3 of the second pad area PDA2. A second anisotropic conductive film ACF2 may be disposed in common on the second pad row PD2 of the first pad area PDA1 and the fourth pad row PD4 of the second pad area PDA2. One of the first and second anisotropic conductive films ACF1 and ACF2 may be deformed like the anisotropic conductive film ACF in FIG. 6A.

Figure 6C:
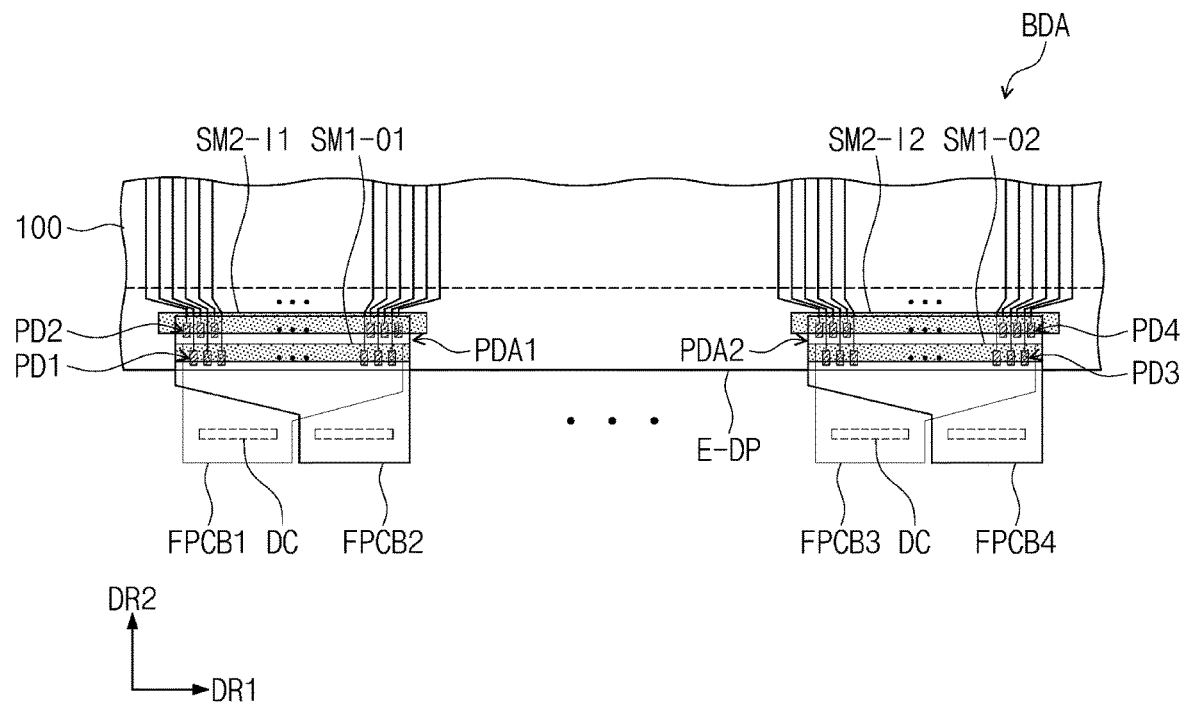
Figure 6D:
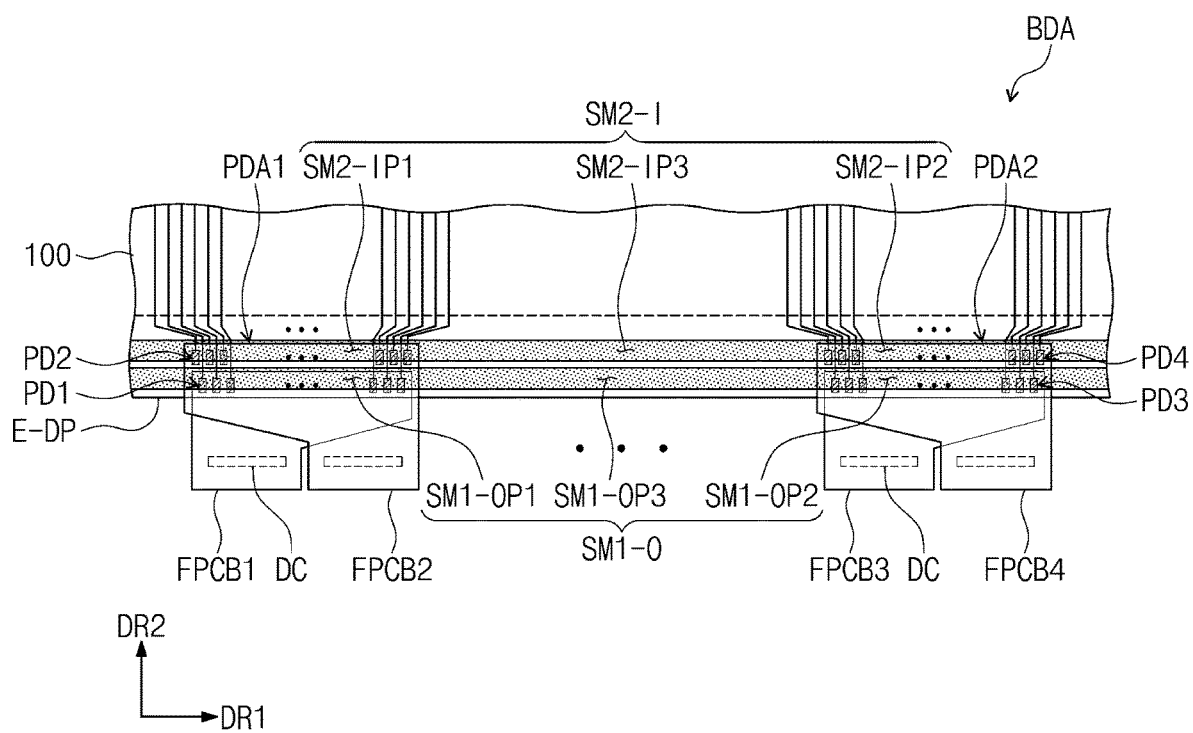
Figure 6E:
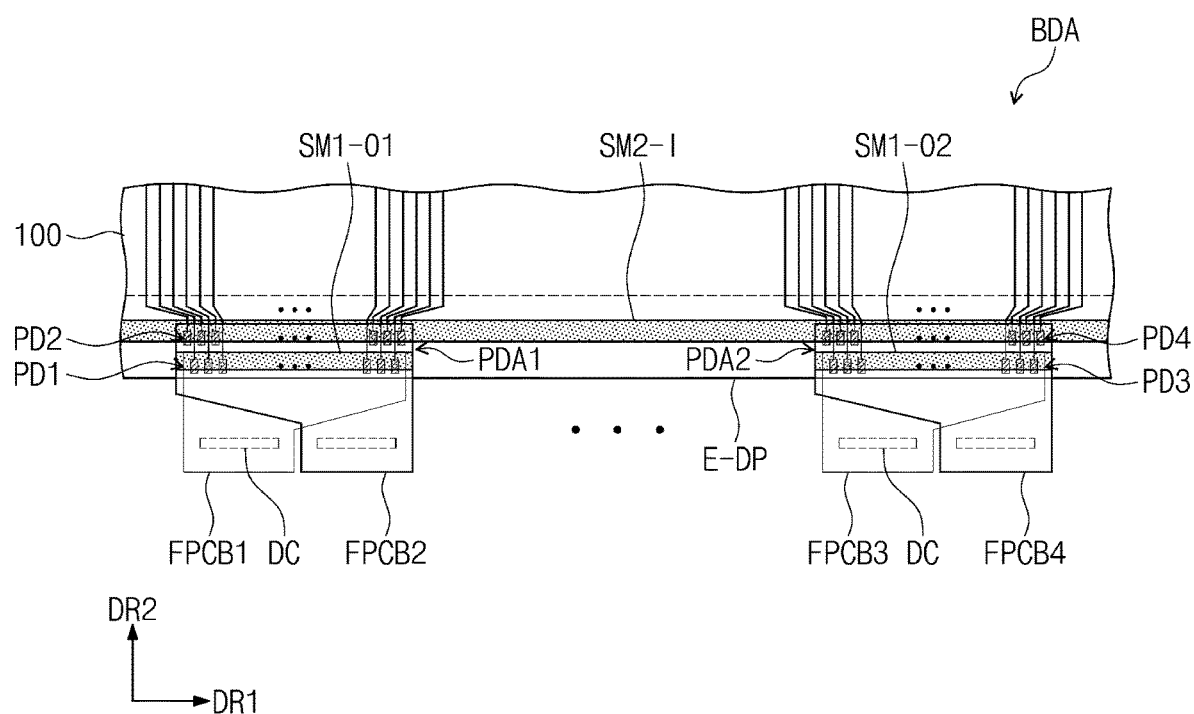

FIGS. 6C to 6E comparatively illustrate shapes of the sealing members. In the embodiment, a sealing member corresponding to the first sealing member SM1 in FIG. 5C is defined as an outer sealing member, and a sealing member corresponding to the second sealing member SM2 is defined as an inner sealing member.

As illustrated in FIG. 6C, a first outer sealing member SM1-O1, a second outer sealing member SM1-O2, a first inner sealing member SM2-I1, and a second inner sealing member SM2-I2 may be arranged in correspondence to the first to fourth pad rows PD1 to PD4. The first outer sealing member SM1-O1, the second outer sealing member SM1-O2, the first inner sealing member SM2-I1, and the second inner sealing member SM2-I2 may be spaced apart from each other.

As illustrated in FIG. 6D, one outer sealing member SM1-O may be disposed on the first and third pad rows PD1 and PD3, and one inner sealing member SM2-1 may be disposed on the second and fourth pad rows PD2 and PD4. The outer sealing member SM1-O may include a first portion SM1-OP1 and a second portion SM1-OP2, which correspond to the first outer sealing member SM1-O1 and the second outer sealing member SM1-O2, respectively.

The outer sealing member SM1-O may include a third portion SM1-OP3 (or a connecting portion) that connects the first portion SM1-OP1 to the second portion SM1-OP2. The third portion SM1-OP3 may have a thickness greater than that of each of the first portion SM1-OP1 and the second portion SM1-OP2. The third portion SM1-OP3 may have the greater thickness because the third portion SM1-OP3 is not compressed by the second connecting circuit board FPCB2.

The inner sealing member SM2-I may be also distinguished by three portions SM2-IP1, SM2-IP2, and SM2-IP3. A first portion SM2-IP1, a second portion SM2-IP2, and a third portion SM2-IP3 (or a connecting portion) may have the substantially same thickness as each other because the first portion SM2-IP1, the second portion SM2-IP2, and the third portion SM2-IP3 are formed through the same process and are not compressed by an external pressure.

As illustrated in FIG. 6E, a first outer sealing member SM1-O1 and a second outer sealing member SM1-O2 may be disposed in correspondence to the first and third pad rows PD1 and PD3, and one inner sealing member SM2-1 may be disposed in correspondence to the second and fourth pad rows PD2 and PD4. Although not separately shown, one outer sealing member may be disposed in correspondence to the first and third pad rows PD1 and PD3, and inner sealing members, which are separated from each other, may be disposed in correspondence to the second and fourth pad rows PD2 and PD4.

FIGS. 7A to 7D are cross-sectional views illustrating a manufacturing process of the display device DD according to an exemplary embodiment of the inventive concepts. Hereinafter, detailed description regarding the same components as those described with reference to FIGS. 1 to 6E will be omitted.

Figure 7A:
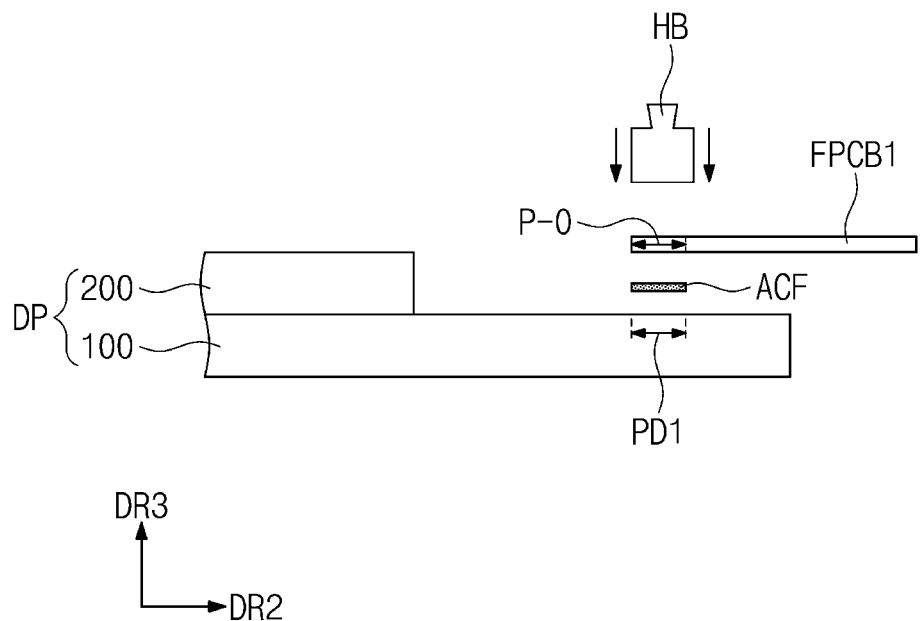
FIGS. 7A, 7B, 7C, and 7D are cross-sectional views illustrating a manufacturing process of the display device according to an exemplary embodiment of the inventive concepts.

As illustrated in FIG. 7A, the display panel DP is provided. First, the first pad row PD1 and the first connecting circuit board FPCB1 are electrically connected to each other. The anisotropic conductive film ACF is disposed between the first pad row PD1 and the first connecting circuit board FPCB1. The anisotropic conductive film ACF may be attached to the first pad row PD1 or attached to the first connecting circuit board FPCB1 while overlapping the output pads P-O (refer to FIG. 4C) of the first connecting circuit board FPCB1.

The first pad row PD1 and the output pads P-O are aligned with each other, and then the first connecting circuit board FPCB1 is pressed by a heating block HB. Although the heating block HB may be a heating pressure member, exemplary embodiments of the inventive concepts are not limited to the kind of the heating block HB. The thermally pressed anisotropic conductive film ACF electrically connects the first pad row PD1 to the output pads P-O.

Figure 7B:
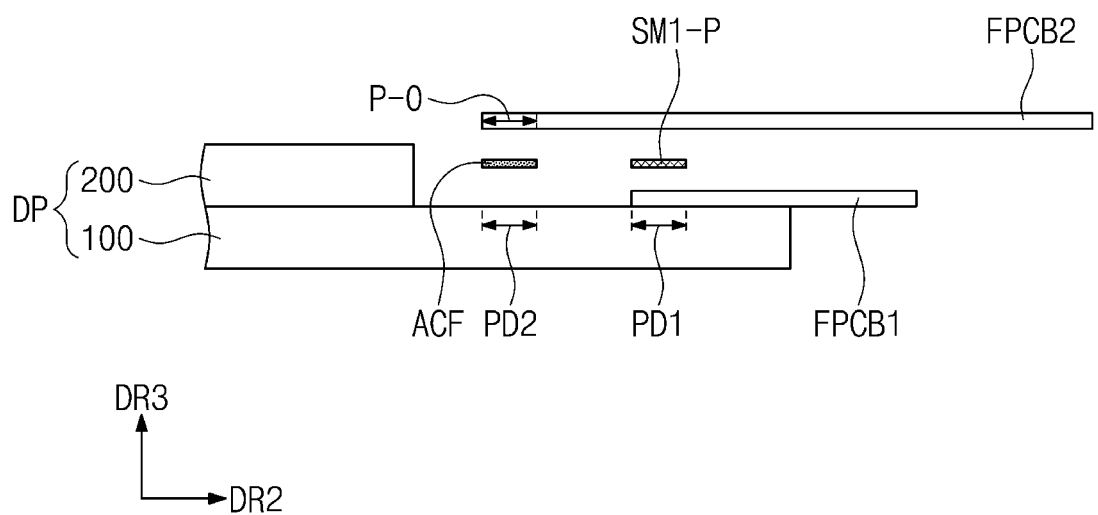
Figure 7C:
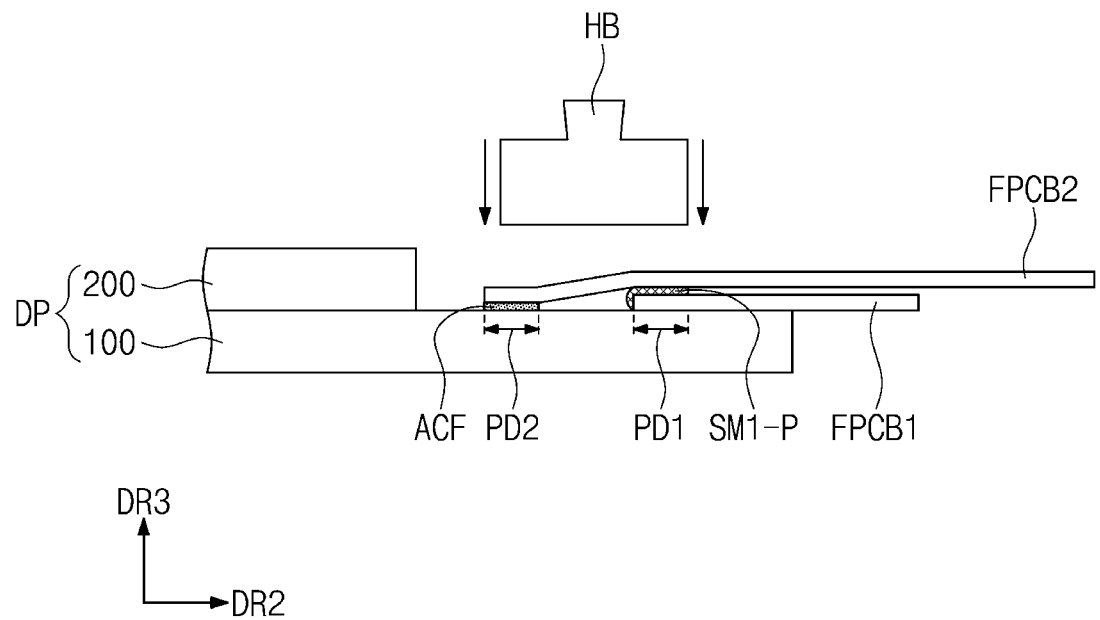

Thereafter, as illustrated in FIGS. 7B and 7C, the second pad row PD2 and the second connecting circuit board FPCB2 are electrically connected to each other.

First, as illustrated in FIG. 7B, the anisotropic conductive film ACF, a preliminary sealing member SM1-P, and the second connecting circuit board FPCB2 are provided. The anisotropic conductive film ACF is disposed between the second pad row PD2 and the second connecting circuit board FPCB2. The anisotropic conductive film ACF may be attached to the second pad row PD2 or attached to the second connecting circuit board FPCB2 while overlapping the output pads P-O of the second connecting circuit board FPCB2.

The anisotropic conductive film ACF having a shape in FIG. 6A is attached to the display panel DP or to the second connecting circuit board FPCB2, and the anisotropic conductive film ACF having a shape in FIG. 6B is attached to the display panel DP.

Also, the preliminary sealing member SM1-P is disposed between the first connecting circuit board FPCB1 and the second connecting circuit board FPCB2. In order to form the first sealing member SM1 having a shape in FIG. 6C, a double-sided adhesive tape may be attached to a top surface of the first connecting circuit board FPCB1, or a synthetic resin layer may be formed on the top surface of the first connecting circuit board FPCB1. Alternatively, a double-sided adhesive tape may be attached to a bottom surface of the second connecting circuit board FPCB2, or a synthetic resin layer may be formed on the bottom surface of the second connecting circuit board FPCB2. In order to form the first sealing member SM1 having a shape in FIG. 6D, a double-sided adhesive tape or a synthetic resin layer may be disposed on the first connecting circuit board FPCB1 and the display panel DP.

As illustrated in FIG. 7C, the second pad row PD2 and the output pads P-O are aligned with each other, and then the second connecting circuit board FPCB2 is pressed by the heating block HB. The thermally pressed anisotropic conductive film ACF electrically connects the second pad row PD2 to the output pads P-O.

The heating block HB presses the second connecting circuit board FPCB2 to melt the preliminary sealing member SM1-P. The preliminary sealing member SM1-P, which is pressed between the top surface of the first connecting circuit board FPCB1 and the bottom surface of the second connecting circuit board FPCB2, is spread to surroundings. The pressed preliminary sealing member SM1-P is spread to a top surface of the display panel DP (e.g., pad area and/or surroundings of the pad area). Accordingly, the first sealing member SM1, which is described with reference to FIGS. 5C and 5D, is formed.

Figure 7D:
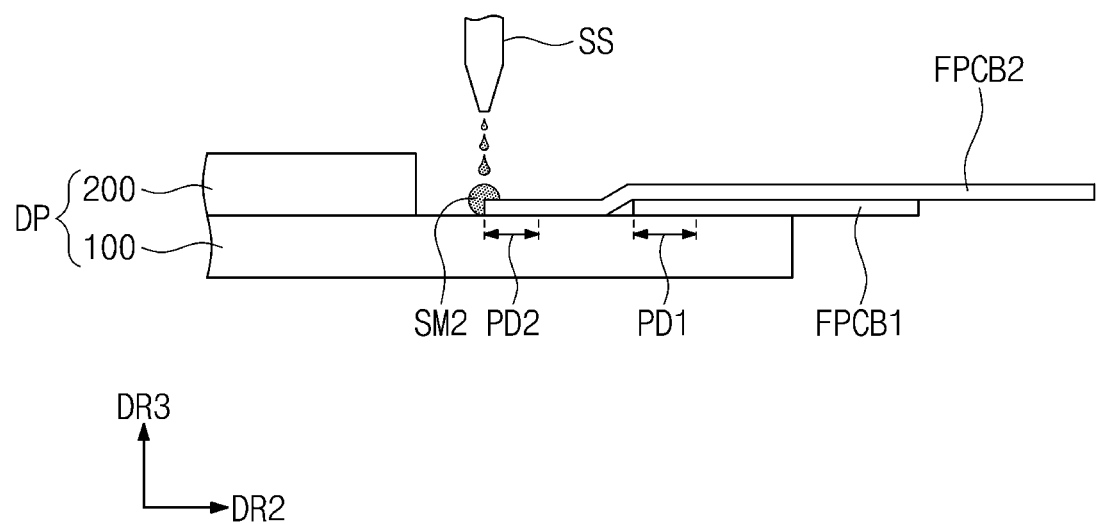

As illustrated in FIG. 7D, the second sealing member SM2 may be formed. A sealant supplier SS may supply a synthetic resin on the display panel DP through a printing method or an injection method. The synthetic resin may be permeated to the second gap GP2 in FIG. 5E through a capillary phenomenon. The synthetic resin may be cured to form the second sealing member SM2.

Figure 8A:
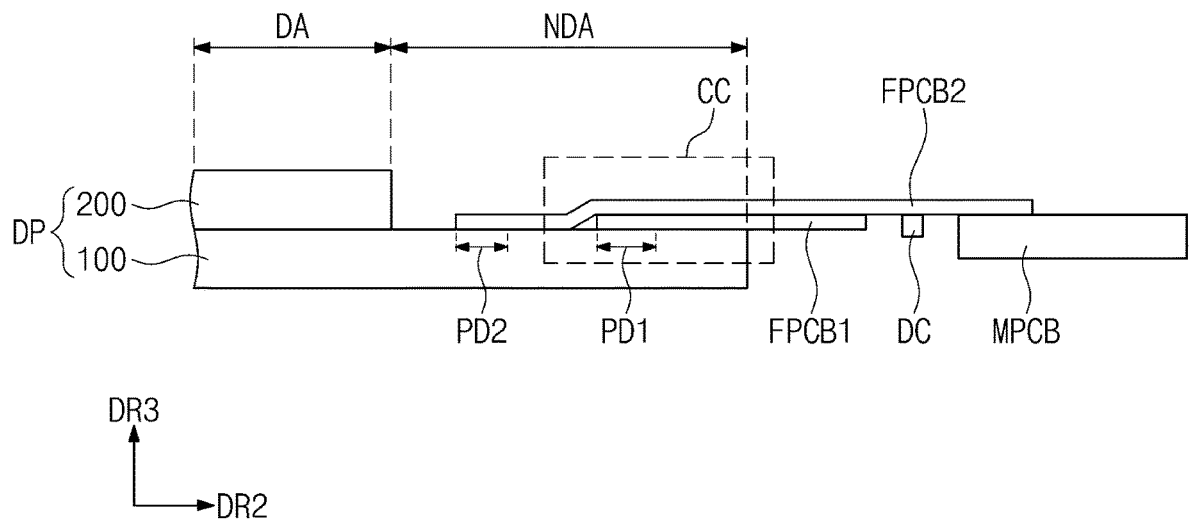
FIG. 8A is a cross-sectional view illustrating the display device according to an exemplary embodiment of the inventive concepts.
Figure 8B:
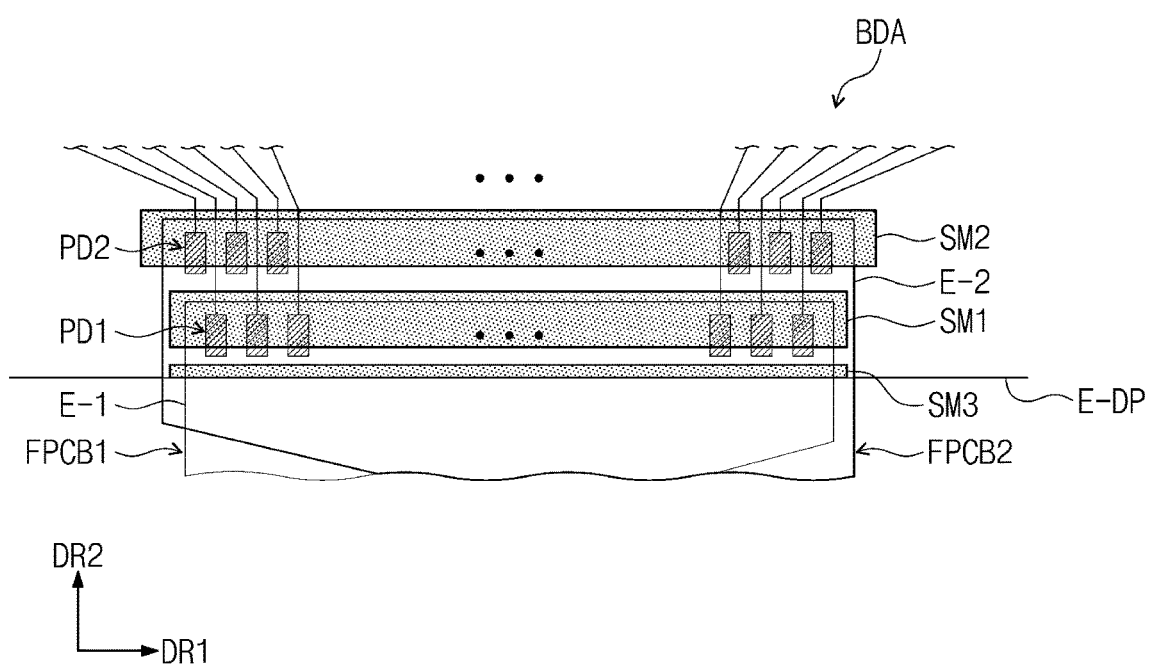
FIG. 8B is an enlarged plan view illustrating the bonding area of the display device according to an exemplary embodiment of the inventive concepts.
Figure 8C:
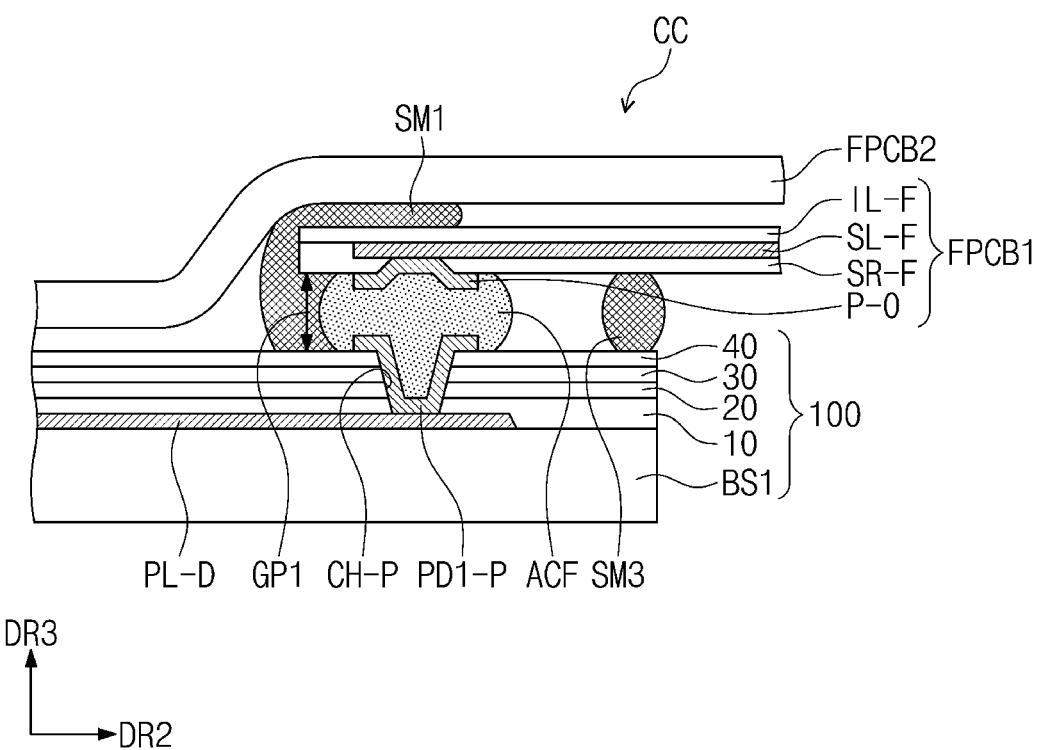
FIG. 8C is an enlarged cross-sectional view illustrating a region CC of FIG. 8A.

FIG. 8A is a cross-sectional view illustrating the display device DD according to an exemplary embodiment of the inventive concepts. FIG. 8B is an enlarged plan view illustrating the bonding area BDA of the display device DD according to an exemplary embodiment of the inventive concepts. FIG. 8C is an enlarged cross-sectional view illustrating a region CC of FIG. 8A. Hereinafter, detailed description regarding the same components as those described with reference to FIGS. 1 to 7D will be omitted.

The display device DD according to the embodiment may further include the third sealing member SM3. The third sealing member SM3 is disposed closer to the edge E-DP of the display panel than the first pad row PD1.

The third sealing member SM3 is disposed between the first connecting circuit board FPCB1 and the display panel DP on a cross-section. The third sealing member SM3 may couple the first connecting circuit board FPCB1 to the display panel DP. The third sealing member SM3 may block moisture that is permeated to the first pad PD1-P from the edge of the display panel DP. The third sealing member SM3 may include a synthetic resin like the first sealing member SM1 in FIG. 5C. The third sealing member SM3 may contain a silicon resin having excellent moisture resistance. The third sealing member SM3 may have the multilayer structure as illustrated in FIG. 5D.

In order to manufacture the display device DD according to an exemplary embodiment of the inventive concepts, the preliminary sealing member SM1-P is prepared in the process in FIG. 7A. The preliminary sealing member SM1-P is disposed between the first connecting circuit board FPCB1 and the display panel DP. The preliminary sealing member SM1-P is pressed on the first connecting circuit board FPCB1 by using the heating block HB. The third sealing member SM3 is formed by curing the pressed preliminary sealing member SM1-P.

As described above, moisture permeated to the bonding area from the outside of the sealing member may be blocked by the sealing member. Accordingly, the first pad of the display panel and the first pad of the connecting circuit board may be prevented from being oxidized.

The sealing member may attach the connecting circuit board to the display panel. Since the coupling force between the connecting circuit board and the display panel increases, the anisotropic conductive film may be prevented from being delaminated.

Although certain exemplary embodiments and implementations have been described herein, other embodiments and modifications will be apparent from this description. Accordingly, the inventive concepts are not limited to such embodiments, but rather to the broader scope of the appended claims and various obvious modifications and equivalent arrangements as would be apparent to a person of ordinary skill in the art.

What is claimed is:

1. A display device comprising:
   a display panel comprising an insulation layer, first pads that are arranged in a first direction and exposed from the insulation layer, and second pads that are spaced apart from the first pads in a second direction crossing the first direction, arranged in the first direction, and exposed from the insulation layer;
   a main circuit board;
   a first connecting circuit board electrically connected to the first pads and the main circuit board;
   a second connecting circuit board electrically connected to the main circuit board and the second pads, which are spaced farther from an edge of the display panel than the first pads, and disposed above the first connecting circuit board;
   a first sealing member configured to seal a first gap defined between the first connecting circuit board and the insulation layer; and
   a second sealing member configured to seal a second gap defined between the second connecting circuit board and the insulation layer, and
   wherein a portion of the first sealing member is disposed between the first connecting circuit board and the second connecting circuit board.

2. The display device of claim 1, wherein the second sealing member comprises a silicon resin.

3. The display device of claim 1, wherein the first sealing member comprises:
   a first adhesion layer attached to the first connecting circuit board;
   a base layer disposed on the first adhesion layer; and
   a second adhesion layer disposed on the base layer and attached to the second connecting circuit board.

4. The display device of claim 3, wherein the base layer comprises a silicon resin.

5. The display device of claim 1, wherein the first sealing member and the second sealing member comprise the same material as each other.

6. The display device of claim 5, wherein the second sealing member has a thickness greater than that of the first sealing member.

7. The display device of claim 1, wherein the first sealing member covers an area of an edge of the first connecting circuit board, which overlaps the display panel.

8. The display device of claim 1, further comprising:
   a first driving chip mounted to the first connecting circuit board; and
   a second driving chip mounted to the second connecting circuit board.

9. The display device of claim 8, wherein a portion of the first connecting circuit board, which overlaps the first driving chip, has a width in the first direction less than that of a portion of the first connecting circuit board, which overlaps the first pads.

10. The display device of claim 1, further comprising a third sealing member disposed between the first connecting circuit board and the insulation layer and configured to couple the first connecting circuit board to the insulation layer and disposed closer to the edge of the display panel than the first pads.

11. A display device comprising:
    a display substrate comprising a first pad area on which a first pad row and a second pad row, which form different pad rows, are disposed and a second pad area on which a third pad row and a fourth pad row, which form different pad rows, are disposed;
    a main circuit board;
    a first connecting circuit board configured to connect the first pad area to the main circuit board and electrically connected to the first pad row;
    a second connecting circuit board configured to connect the first pad area to the main circuit board, electrically connected to the second pad row, and disposed above the first connecting circuit board;
    a third connecting circuit board configured to connect the second pad area to the main circuit board and electrically connected to the third pad row;
    a fourth connecting circuit board configured to connect the second pad area to the main circuit board, electrically connected to the fourth pad row, and disposed above the third connecting circuit board;
    a first outer sealing member configured to seal a gap defined between the first connecting circuit board and the first pad area; and
    a second outer sealing member configured to seal a gap defined between the third connecting circuit board and the second pad area, and
    wherein a portion of the first outer sealing member is disposed between the first connecting circuit board and the second connecting circuit board and a portion of the second outer sealing member is disposed between the third connecting circuit board and the fourth connecting circuit board.

12. The display device of claim 11, wherein the first outer sealing member is spaced apart from the second outer sealing member.

13. The display device of claim 11, wherein the first outer sealing member and the second outer sealing member are connected to each other to define an outer sealing member.

14. The display device of claim 13, wherein a portion of the outer sealing member connects the first outer sealing member to the second outer sealing member is defined as a connecting portion, and
    the connecting portion has a thickness greater than that of the first outer sealing member.

15. The display device of claim 11, further comprising a first inner sealing member configured to seal a gap between the second connecting circuit board and the first pad area; and
    a second inner sealing member configured to seal a gap between the fourth connecting circuit board and the second pad area.

16. The display device of claim 15, wherein the first inner sealing member and the second inner sealing member are connected to each other to define an inner sealing member.

17. The display device of claim 16, wherein a portion of the inner sealing member connecting the first inner sealing member to the second inner sealing member is defined as a connecting portion, and the connecting portion has the substantially same thickness as the first inner sealing member.

18. The display device of claim 11, further comprising anisotropic conductive films, wherein each of the anisotropic conductive films is disposed between the first pad row and the first connecting circuit board, between the second pad row and the second connecting circuit board, between the third pad row and the third connecting circuit board, and between the fourth pad row and the fourth connecting circuit board.

19. The display device of claim 11, further comprising an anisotropic conductive film, wherein the anisotropic conductive film is disposed between the first pad row and the first connecting circuit board and between third pad row and the third connecting circuit board.

20. A method for manufacturing a display device, the method comprising:

providing a display panel comprising a pad area on which first pads and second pads, which are disposed on different pad rows from each other, are disposed;

electrically connecting a first connecting circuit board to the first pads that is closer to an edge of the display panel than the second pads; and electrically connecting a second connecting circuit board to the second pads, wherein the electrically connecting of the second connecting circuit board to the second pads comprises:

arranging a conductive adhesion member between the second pads and pads, which correspond thereto, of the second connecting circuit board;

arranging a preliminary sealing member between the first connecting circuit board and the second connecting circuit board; and pressing the conductive adhesion member and the preliminary sealing member on the second connecting circuit board by using a heating block.

* * * * *